(12) United States Patent
Okura et al.

(10) Patent No.: US 9,973,700 B2
(45) Date of Patent: May 15, 2018

(54) SOLID-STATE IMAGING DEVICE, METHOD FOR DRIVING SOLID-STATE IMAGING DEVICE, AND ELECTRONIC APPARATUS

(71) Applicant: Brillnics Japan Inc., Tokyo (JP)

(72) Inventors: Shunsuke Okura, Tokyo (JP); Isao Takayanagi, Tokyo (JP)

(73) Assignee: Brillnics Japan Inc., Tokyo (JP)

(*) Notice: Subject to any disclaimer, the term of this patent is extended or adjusted under 35 U.S.C. 154(b) by 0 days. days.

(21) Appl. No.: 15/154,229

(22) Filed: May 13, 2016

(65) Prior Publication Data
US 2016/0337567 A1 Nov. 17, 2016

(30) Foreign Application Priority Data
May 14, 2015 (JP) .................................. 2015-098806

(51) Int. Cl.
*H04N 5/235* (2006.01)
*H04N 3/14* (2006.01)
(Continued)

(52) U.S. Cl.
CPC ..... *H04N 5/2327* (2013.01); *H01L 27/14609* (2013.01); *H01L 27/14616* (2013.01);
(Continued)

(58) Field of Classification Search
CPC .......... H01L 27/14641; H04N 5/37457; H04N 5/347; H04N 5/3745; H04N 5/3415; H04N 5/343; H04N 5/376; H04N 5/35572
See application file for complete search history.

(56) References Cited

U.S. PATENT DOCUMENTS 7,674,648 B2 * 3/2010 Compton ............. H04N 5/3559
438/59
9,343,500 B2 * 5/2016 Mabuchi ................ H04N 5/363
(Continued)

FOREIGN PATENT DOCUMENTS

| JP | 2000-165754 A | 6/2000 |
|---|---|---|
| JP | 2013-033896 A | 2/2013 |
| JP | 6043002 B1 | 12/2016 |

OTHER PUBLICATIONS

Office Action dated Dec. 8, 2015, issued in counterpart Japanese application No. 2015-098806, with English Translation. (10 pages).
(Continued)

*Primary Examiner* — Chia-Wei A Chen
(74) *Attorney, Agent, or Firm* — Westerman, Hattori, Daniels & Adrian, LLP

(57) ABSTRACT

A solid-state imaging device, a method for driving the solid-state imaging device, and an electronic apparatus capable of suppressing occurrence of motion distortion while realizing widening of dynamic range and in turn realizing a higher image quality are provided. Each pixel includes a photo diode PD which accumulates a charge generated by photo-electric conversion in an accumulation period, a transfer transistor capable of transferring the accumulated charge in a transfer period, a floating diffusion FD to which the charge accumulated in the photo diode PD is transferred, a source-follower transistor which converts the charge of the floating diffusion FD to a voltage signal in accordance with the charge quantity, and a capacity changing portion capable of changing the capacity of the floating diffusion FD in accordance with a capacity changing signal, the capacity of the floating diffusion FD being changed by the capacity changing portion in a predetermined period in one readout period with respect to the accumulation period (Continued)

and a conversion gain being switched in this one readout period.

12 Claims, 20 Drawing Sheets

(51) Int. Cl.
  *H04N 5/335* (2011.01)
  *H04N 5/232* (2006.01)
  *H04N 5/378* (2011.01)
  *H04N 5/3745* (2011.01)
  *H04N 5/347* (2011.01)
  *H04N 5/217* (2011.01)
  *H01L 27/146* (2006.01)
  *H04N 5/353* (2011.01)
  *H04N 5/355* (2011.01)

(52) U.S. Cl.
  CPC .. *H01L 27/14621* (2013.01); *H01L 27/14627* (2013.01); *H01L 27/14641* (2013.01); *H01L 27/14645* (2013.01); *H01L 27/14654* (2013.01); *H04N 5/2176* (2013.01); *H04N 5/347* (2013.01); *H04N 5/353* (2013.01); *H04N 5/35554* (2013.01); *H04N 5/378* (2013.01); *H04N 5/37457* (2013.01)

(56) References Cited

U.S. PATENT DOCUMENTS

| | | | |
|---|---|---|---|
| 2005/0052554 A1 | 3/2005 | Sakurai et al. | |
| 2005/0224843 A1* | 10/2005 | Boemler | H01L 27/14603 257/233 |
| 2006/0060897 A1* | 3/2006 | Kuwazawa | H01L 27/14603 257/292 |
| 2006/0274176 A1* | 12/2006 | Guidash | H01L 27/14643 348/300 |
| 2007/0158713 A1* | 7/2007 | Ohkawa | H01L 27/14603 257/292 |
| 2008/0210993 A1* | 9/2008 | Oshikubo | H01L 27/14609 257/292 |
| 2008/0231727 A1* | 9/2008 | Compton | H04N 5/3559 348/229.1 |
| 2008/0237446 A1* | 10/2008 | Oshikubo | H01L 27/14603 250/208.1 |
| 2009/0114961 A1* | 5/2009 | Ki | H04N 5/3559 257/292 |
| 2010/0118167 A1* | 5/2010 | Johnson | H04N 5/3745 348/294 |
| 2010/0182465 A1* | 7/2010 | Okita | H04N 5/343 348/273 |
| 2011/0085066 A1* | 4/2011 | Sugawa | H04N 5/378 348/302 |
| 2012/0002089 A1* | 1/2012 | Wang | H01L 27/14603 348/297 |
| 2012/0257093 A1 | 10/2012 | Sa et al. | |
| 2012/0262616 A1* | 10/2012 | Sa | H04N 5/3745 348/311 |
| 2013/0070109 A1* | 3/2013 | Gove | H04N 5/347 348/207.1 |
| 2014/0226046 A1* | 8/2014 | Lahav | H04N 5/37457 348/296 |
| 2015/0124139 A1* | 5/2015 | Ishiwata | H04N 5/37452 348/308 |
| 2015/0201140 A1 | 7/2015 | Solhusvik et al. | |
| 2015/0312491 A1* | 10/2015 | Egawa | H04N 5/35563 348/223.1 |
| 2015/0319384 A1* | 11/2015 | Onishi | H04N 5/3559 348/300 |
| 2015/0350584 A1* | 12/2015 | Fenigstein | H04N 5/355 250/208.1 |
| 2016/0014358 A1* | 1/2016 | Itoh | H04N 5/378 348/294 |
| 2016/0141326 A1* | 5/2016 | Hanzawa | H01L 27/14603 250/208.1 |

OTHER PUBLICATIONS

Non-Final Office Action dated Aug. 23, 2017, issued in U.S. Appl. No. 15/637,519 (13 pages).

Non-Final Office Action dated Oct. 16, 2017, issued in U.S. Appl. No. 15/290,550 (29 pages).

* cited by examiner

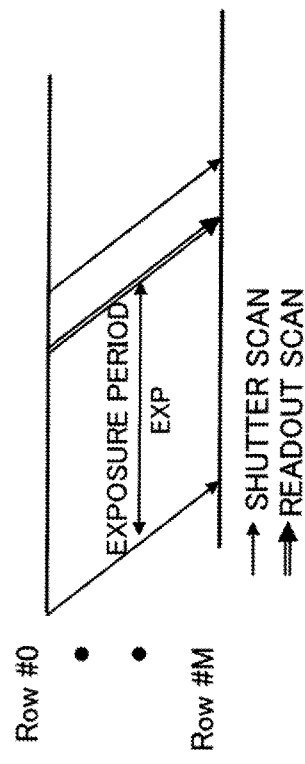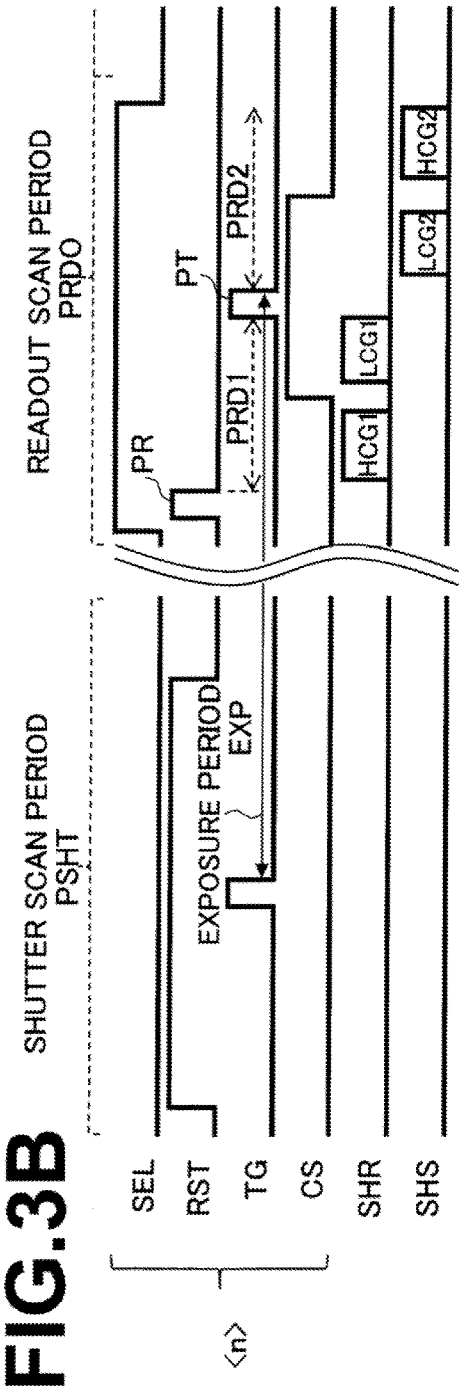

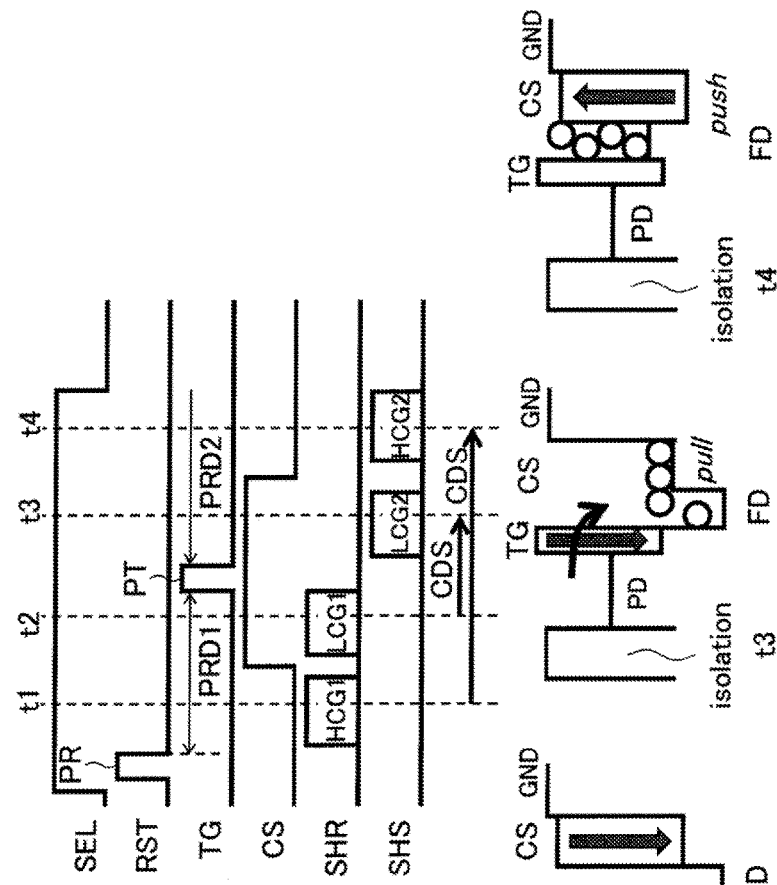
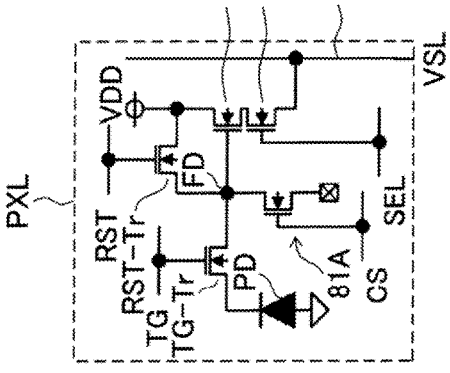
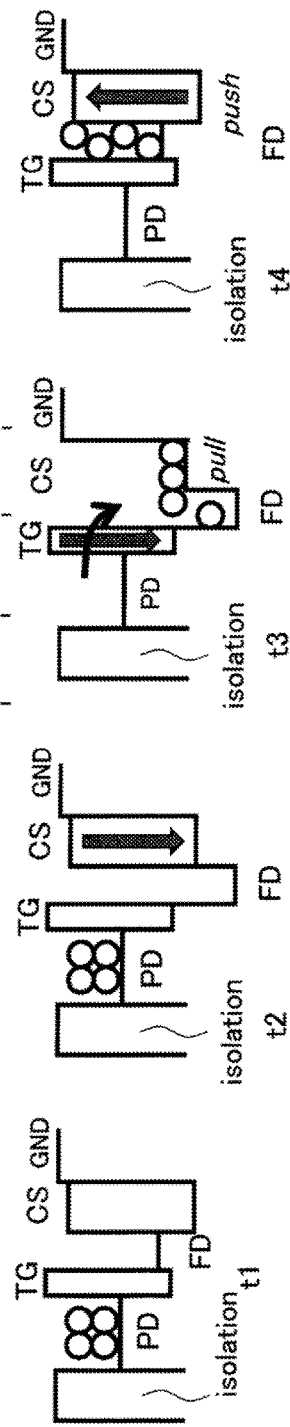
FIG.7A
FIG.7B
FIG.7C

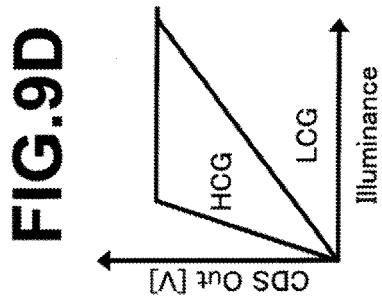
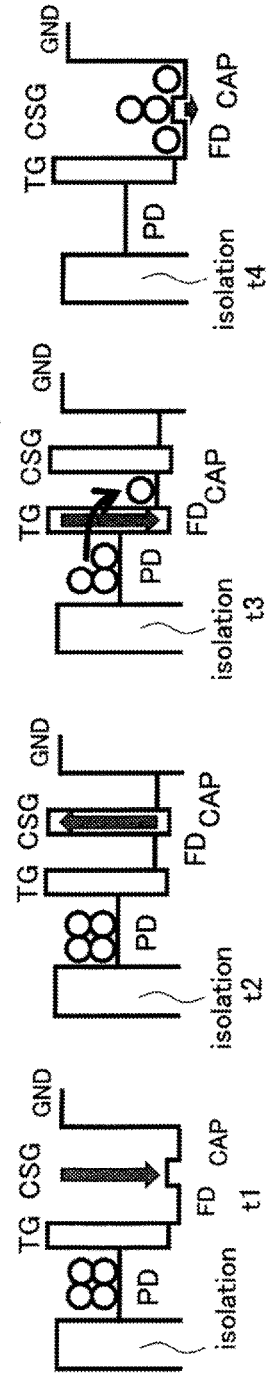
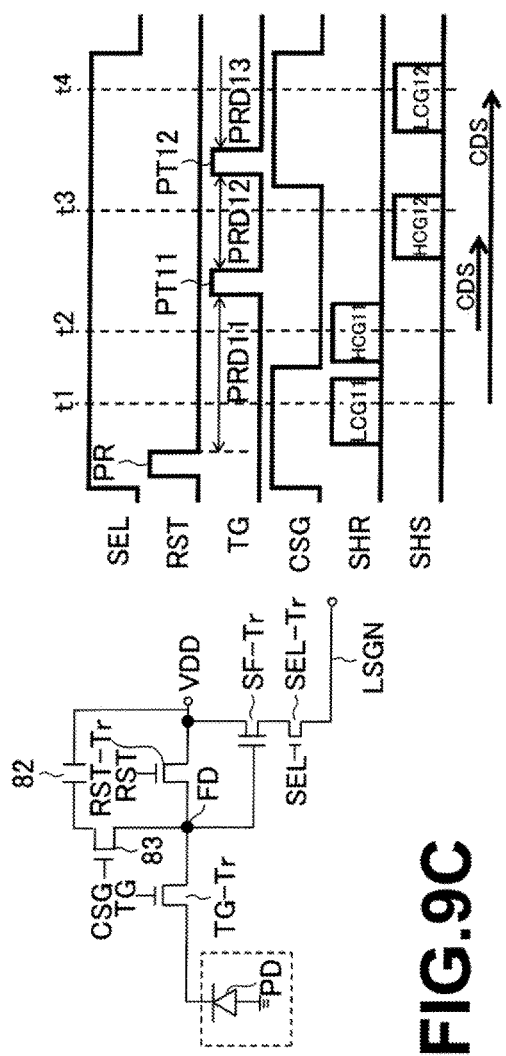

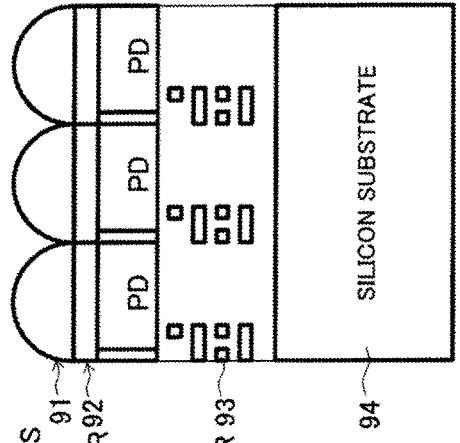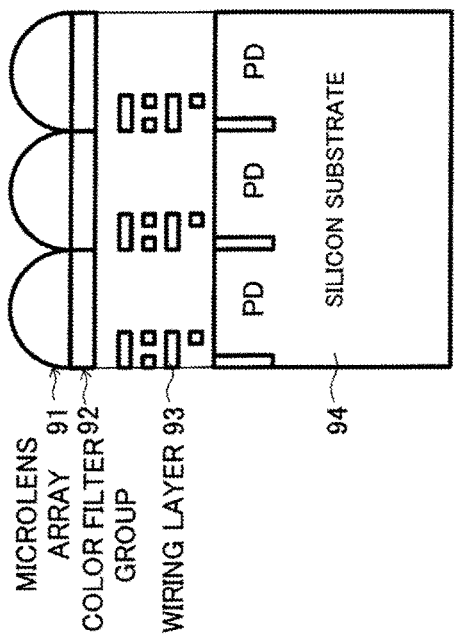

SOLID-STATE IMAGING DEVICE, METHOD FOR DRIVING SOLID-STATE IMAGING DEVICE, AND ELECTRONIC APPARATUS

CROSS REFERENCE TO RELATED APPLICATION

The present invention contains subject matter related to Japanese Patent Application No. 2015-98806 filed in the Japan Patent Office on May 14, 2015, the entire contents of which being incorporated herein by reference.

TECHNICAL FIELD

The present invention relates to a solid-state imaging device, a method for driving the solid-state imaging device, and an electronic apparatus

BACKGROUND ART

As a solid-state imaging device (image sensor) using a photo-electric conversion element detecting light and generating a charge, a CMOS (Complementary Metal Oxide Semiconductor) image sensor has been put into practical use. CMOS image sensors have been widely applied as parts of digital cameras, video cameras, monitoring cameras, medical endoscopes, personal computers (PC), mobile phones and another portable terminals (mobile devices), and various other electronic apparatuses.

A CMOS image sensor has photodiodes (photo-electric conversion elements) and floating diffusion (FD) amplifiers having FD layers corresponding to the individual pixels. Readout is performed mainly by the column parallel output method of selecting one row of the pixel array and simultaneously reading out the pixels in the column output direction.

In this regard, in order to improve the characteristics, various methods for realizing a CMOS image sensor having a high image quality with a wide dynamic range have been proposed (see for example PLT 1).

PLT 1 discloses a dynamic range widening technique for dividing the imaging into two or more exposure times different from each other, that is, imaging corresponding to a high illuminance side by a short exposure time and imaging corresponding to a low illuminance by a long exposure time. Further, PLT 1 discloses a dynamic range widening technique which makes the capacities of the floating diffusions FD variable.

CITATION LIST

Patent Literature

PLT 1. Japanese Patent Publication No. 2000-165754A

Technical Problem

However, in the dynamic range widening technique disclosed in PLT 1, the imaging by a low illuminance and the imaging by a high illuminance are carried out at different times (periods), therefore signals obtained by plurality of exposures are used. Accordingly, there are the disadvantages that the deviation occurs in the images, motion distortion occurs, and the quality of a moving image is degraded.

SUMMARY OF INVENTION

The present invention provides a solid-state imaging device, a method for driving the solid-state imaging device, and an electronic apparatus capable of suppressing occurrence of motion distortion while realizing widening of dynamic range and in turn realizing a higher image quality.

A solid-state imaging device of a first aspect of the present invention has a pixel portion in which pixels are arranged, wherein each pixel includes a photo-electric conversion element which accumulates a charge generated by photo-electric conversion in an accumulation period, a transfer element capable of transferring the charge accumulated in the photo-electric conversion element in a transfer period, a floating diffusion to which the charge accumulated in the photo-electric conversion element is transferred through the transfer element, a source-follower element which converts the charge of the floating diffusion to a voltage signal in accordance with the charge quantity, and a capacity changing portion capable of changing the capacity of the floating diffusion in accordance with a capacity changing signal, the capacity of the floating diffusion being changed by the capacity changing portion in a predetermined period in one readout period with respect to the accumulation period and a conversion gain being switched in this one readout period.

A second aspect of the present invention is a method for driving a solid-state imaging device having a pixel portion in which pixels are arranged, wherein each pixel includes a photo-electric conversion element which accumulates a charge generated by photo-electric conversion in an accumulation period, a transfer element capable of transferring the charge accumulated in the photo-electric conversion element in a transfer period, a floating diffusion to which the charges accumulated in the photo-electric conversion element is transferred through the transfer element, a source-follower element which converts the charge of the floating diffusion to a voltage signal in accordance with the charge quantity, and a capacity changing portion capable of changing the capacity of the floating diffusion in accordance with a capacity changing signal, comprising changing the capacity of the floating diffusion by the capacity changing portion in the predetermined period in one readout period with respect to the accumulation period and switching a conversion gain in this one readout period.

An electronic apparatus of a third aspect of the present invention has a solid-state imaging device having a pixel portion in which pixels are arranged a and an optical system for forming an object image at the solid-state imaging device, wherein each pixel of the solid-state imaging device includes a photo-electric conversion element which accumulates a charge generated by photo-electric conversion in an accumulation period, a transfer element capable of transferring the charge accumulated in the photo-electric conversion element in a transfer period, a floating diffusion to which the charge accumulated in the photo-electric conversion element is transferred through the transfer element, a source-follower element which converts the charge of the floating diffusion to a voltage signal in accordance with the charge quantity, and a capacity changing portion capable of changing the capacity of the floating diffusion in accordance with a capacity changing signal, the capacity of the floating diffusion being changed by the capacity changing portion in a predetermined period in one readout period with respect to the accumulation period and a conversion gain being switched in this one readout period.

Alternatively, a solid-state imaging device of another aspect of the present invention has the readout portion. The readout portion, during the readout scan period, sets a plurality of transfer periods for performing transfer processing and performs the processing of reading out the signal in accordance with the accumulated charge in each readout period after each transfer period.

Advantageous Effects of Invention

According to the present invention, it is possible to suppress occurrence of motion distortion while realizing widening of the dynamic range and in turn realize a higher image quality.

BRIEF DESCRIPTION OF DRAWINGS

FIG. 3A and FIG. 3B are diagrams showing operation timings of a shutter scan and readout scan at the time of usual readout operation in the present embodiment.

FIG. 7A to FIG. 7C are diagrams for explaining the operation for realizing a wide dynamic range in a case where the MOS structure capacitor configuring the capacity changing portion according to the first embodiment is applied.

FIG. 9A to FIG. 9D are diagrams for explaining the operation for realizing a wide dynamic range in a case where a capacitor and a switch are applied to the capacity changing portion according to the second embodiment.

FIG. 19A and FIG. 19B are diagrams for explaining that the solid-state imaging device according to the embodiment of the present invention can be applied to both of a front-surface irradiation type image sensor and a back-surface irradiation type image sensor.

DESCRIPTION OF EMBODIMENTS

Below, embodiments of the present invention will be explained with reference to the drawings.

First Embodiment

Figure 1:
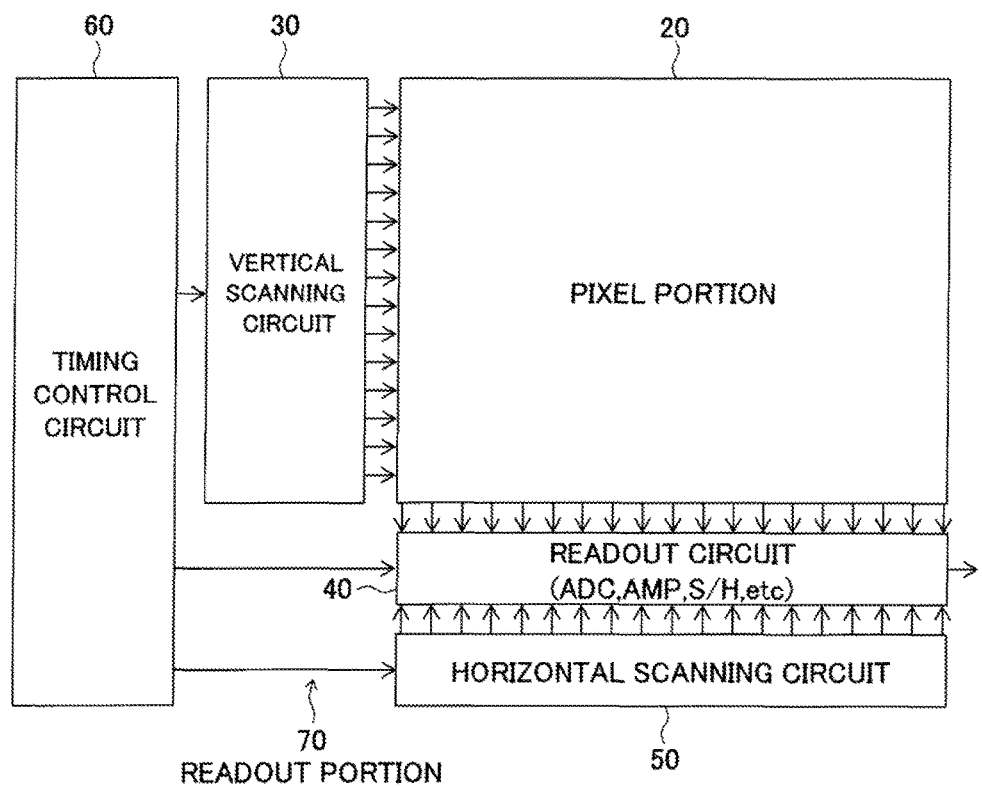
FIG. 1 is a block diagram showing an example of the configuration of a solid-state imaging device according to a first embodiment of the present invention.

FIG. 1 is a block diagram showing an example of the configuration of a solid-state imaging device according device according to a first embodiment of the present invention. In the present embodiment, a solid-state imaging device 10 is configured by for example a CMOS image sensor.

This solid-state imaging device 10, as shown in FIG. 1, has a pixel portion 20 as an imaging portion, a vertical scanning circuit (row scanning circuit) 30, a readout circuit (column readout circuit) 40, a horizontal scanning circuit (column scanning circuit) 50, and a timing control circuit 60 as principal components. Among these components, for example, the vertical scanning circuit 30, readout circuit 40, and timing control circuit 60 are used to configure a readout portion 70 of a pixel signal.

In the present embodiment, in the solid-state imaging device 10, as will be explained in detail later, the pixels which are arranged in the pixel portion 20 in a matrix state (or the pixel portion 20) are configured so that each includes a capacity changing portion capable of changing the capacity of a floating diffusion in accordance with a capacity changing signal. In the solid-state imaging device 10, the capacity of a floating diffusion is changed by the capacity changing portion during one accumulation period of a charge (exposure period) or in a predetermined period in one readout period after the accumulation period and a conversion gain is switched within this readout period.

In the present embodiment, the readout portion 70 is configured so that it can perform, in one readout period, a first conversion gain mode reading operation for reading out a pixel signal by a first conversion gain in accordance with a first capacity set by the capacity changing portion and a second conversion gain mode reading operation for reading out a pixel signal by a second conversion gain in accordance with a second capacity (different from the first capacity) set by the capacity changing portion. That is, the solid-state imaging device 10 of the present embodiment is provided as a solid-state imaging element having a wide dynamic range, which outputs, with respect to the charge (electrons) which is generated by photo-electric conversion in one accumulation period (exposure period), a signal by switching the first conversion gain (for example high conversion gain) mode and the second conversion gain (low conversion gain) mode inside the pixel in one readout period, and outputs both of a bright signal and a dark signal.

The readout portion 70 in the present embodiment basically performs the first conversion gain mode reading operation and second conversion gain mode reading operation in the accumulation period following a reset period for discharging the charge of the photodiode and the floating diffusion. Further, in the present embodiment, the readout portion 70, in the readout period after at least one transfer period which starts after the readout period following the reset period, performs at least one of the first conversion gain mode reading operation or second conversion gain mode reading operation. That is, there also exists a case where both of the first conversion gain mode reading operation and the second conversion gain mode reading operation are carried out in the readout period after the transfer period.

In the usual pixel readout operation, by driving by the readout portion 70, a shutter scan is carried out, then a readout scan is carried out. However, the first conversion gain mode reading operation (HCG) and second conversion gain mode reading operation (LCG) are carried out in the readout scan period.

Below, after explaining the configurations and functions of the portions of the solid-state imaging device in brief, the configuration of the capacity changing portion, the readout processing concerned with that, and so on will be explained in detail.

Configurations of Pixel Portion 20 and Pixel PXL

In the pixel portion 20, a plurality of pixels each including a photodiode (photo-electric conversion element) and a pixel amplifier are arranged in a two-dimensional matrix comprised of N rows and M columns.

Figure 2:
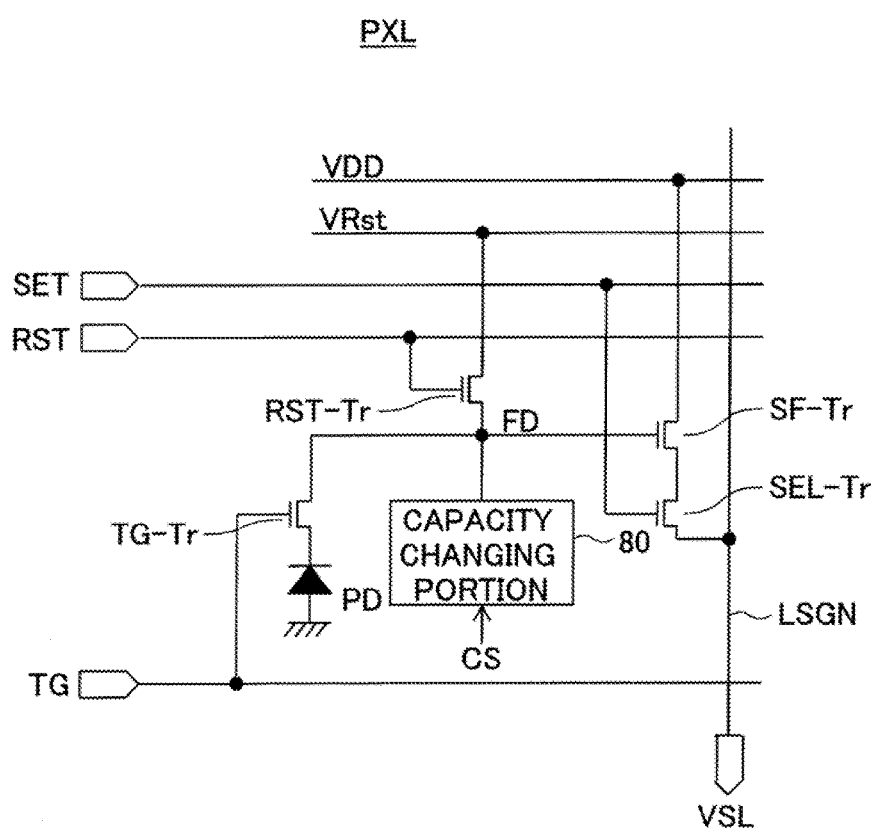
FIG. 2 is a circuit diagram showing an example of a pixel according to the first embodiment.

FIG. 2 is a circuit diagram showing an example of a pixel according to the present embodiment.

This pixel PXL has for example a photo-electric conversion element comprised of a photodiode (PD). For this photodiode PD, provision is made of a transfer element comprised of a transfer transistor TG-Tr, a reset element comprised of a reset transistor RST-Tr, a source-follower element comprised of a source-follower transistor SF-Tr, and a selection element comprised of a selection transistor SEL-Tr.

Further, the pixel PXL has a capacity changing portion 80 which is connected to a floating diffusion FD and can change the capacity of the floating diffusion FD in accordance with a capacity changing signal CS.

The photodiode PD generates a signal charge (electrons) of a quantity in accordance with the incident light quantity and accumulates (stores) the same. Below, an explanation will be given of a case where the signal charge is comprised of electrons and each transistor is an n-type transistor. However, the signal charge may be a hole or each transistor may be a p-type transistor as well. Further, the present embodiment is effective even in a case where each transistor is shared among a plurality of photodiodes and a case where a three-transistor (3Tr) pixel not having a selection transistor is employed.

The transfer transistor TG-Tr is connected between the photodiode PD and the floating diffusion FD and is controlled through a control line TG. The transfer transistor TG-Tr is selected in a period where the control line TG is at a high level H and becomes a conductive state and transfers a charge (electrons) which is generated by photo-electric conversion and accumulated (stored) in the photodiode PD to the floating diffusion FD.

The reset transistor RST-Tr is connected between a power supply line VRst and the floating diffusion and the floating diffusion FD and is controlled through a control line RST.

Note that, the reset transistor RST-Tr may be configured so that it is connected between a power supply line VDD and the floating diffusion FD and is controlled through the control line RST as well. The reset transistor RST-Tr is selected in the period where the control line RST is at the H level and becomes a conductive state and resets the floating diffusion FD to a potential of the power supply line VRst (or VDD).

The source-follower transistor SF-Tr and the selection transistor SEL-Tr are connected in series between the power supply line VDD and a vertical signal line LSGN. To a gate of the source-follower transistor SF-Tr, the floating diffusion FD is connected. The selection transistor SEL-Tr is controlled through a control line SEL. The selection transistor SEL-Tr is selected in the period where the control line SEL is at the H level and becomes a conductive state. Due to this, the source-follower transistor SF-Tr outputs a readout signal VSL of column output obtained by converting the charge of the floating diffusion FD to a voltage signal in accordance with the charge quantity (potential) to the vertical signal line LSGN. These operations are for example carried out simultaneously in parallel for each of one row's worth of the pixels since gates of the transfer transistor TG-Tr, reset transistor RST-Tr, and the selection transistor SEL-Tr are connected in units of rows.

In the pixel portion 20, pixels PXL are arranged in N rows and M columns, therefore the number of each of the control lines SEL, RST, and TG is N, and the number of the vertical signal lines LSGN is M. In FIG. 1, each of the control lines SEL, RST, and TG is expressed as one row scanning control line.

The vertical scanning circuit 30 drives pixels through the row scanning control line in the shutter row and readout row in accordance with the control of the timing control circuit 60. Further, the vertical scanning circuit 30 outputs a row selection signal having a row address of a read row for reading out the signal and a shutter row for resetting the charge accumulated in the photodiode PD according to the address signal.

As explained above, in the usual pixel readout operation, by driving by the vertical scanning circuit 30 of the readout portion 70, the shutter scan is carried out, then the readout scan is carried out.

FIG. 3A and FIG. 3B are diagrams showing operation timings of the shutter scan and the readout scan at the time of the usual pixel readout operation in the present embodiment. FIG. 3A shows the relationships among the shutter scan, exposure period, and readout scan, and readout scan, and FIG. 3B shows concrete operation timings of the shutter scan and readout scan.

The control line SEL which controls the ON (conductive) and OFF (nonconductive) states of the selection transistor SEL-Tr is set at an L level in the shutter scan period PSHT so that the selection transistor SEL-Tr is held in the nonconductive state, while is set at an H level in the readout scan period PRDO so that the selection transistor SEL-Tr is held in the conductive state. Further, in the shutter scan period PSHT, the control line TG is set at an H level in the predetermined period for the period where the control line RST is at the H level, and the photodiode PD and floating diffusion FD are reset through the reset transistor RST-Tr and transfer transistor TG-Tr.

In the readout scan period PRDO, the control line RST is set at the H level, the floating diffusion FD is reset through the reset transistor RST-Tr, and the signal in the reset state is read out in a readout period PRD1 after this reset period PR. After the readout period PRD1, for the predetermined period, the control line TG is set at an H level, the accumulated charge in the photodiode PD is transferred through the transfer transistor TG-Tr to the floating diffusion FD, and a signal in accordance with the accumulated electrons (charge) is read out in a readout period PRD2 after this transfer period PT.

Note that, in the usual pixel readout operation in the first embodiment, as shown in FIG. 3B, the accumulation period (exposure period) EXP is the period from when the control line TG is switched to the L level after resetting the photodiode PD and floating diffusion FD during the shutter scan period PSHT to when the control line TG is switched to the L level in order to end the transfer period PT during the readout scan period PRDO.

The readout circuit 40 may be configured so that it includes a plurality of column signal processing circuits (not shown) which are arranged corresponding to the column outputs of the pixel portion 20 and so that column parallel processing is possible in the plurality of column signal processing circuits.

The readout circuit 40 can be configured including a correlated double sampling (CDS) circuit and ADC (analog/digital converter: AD converter), amplifier (AMP), sample/hold (S/H) circuit, and so on.

Figure 4A:
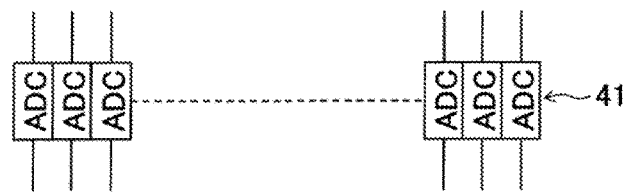
FIG. 4A to FIG. 4C are diagrams for explaining examples of the configuration of a readout system of column output of a pixel portion in the solid-state imaging device according to the embodiment of the present invention.
Figure 4B:
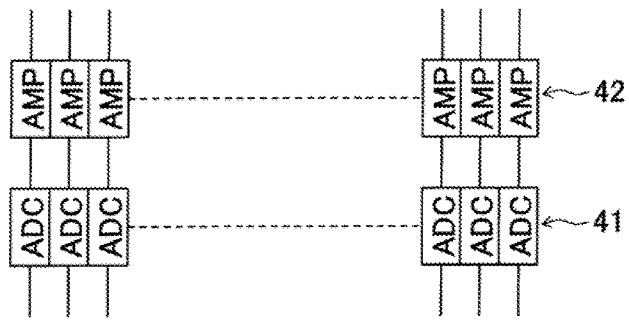
Figure 4C:
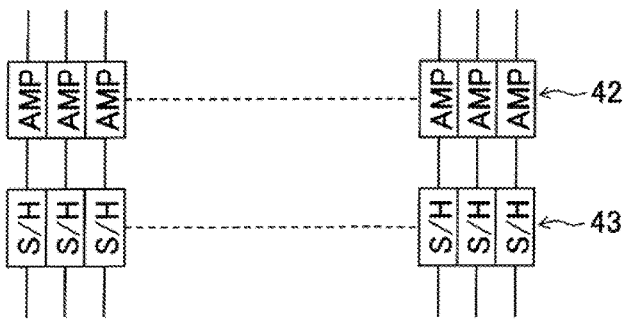

In this way, the readout circuit 40, for example as shown in FIG. 4A, may be configured by including an ADC 41 which converts a readout signal VSL of each column output of the pixel portion 20 to a digital signal. Otherwise, in the readout circuit 40, for example as shown in FIG. 4B, an amplifier (AMP) 42 for amplifying the readout signal VSL of each column output of the pixel portion 20 may be arranged. Further, in the readout circuit 40, for example as shown in FIG. 4C, a sample/hold (S/H) circuit 43 for sampling and holding the readout signal VSL of each column output of the pixel portion 20 may be arranged.

The horizontal scanning circuit 50 scans the signals processed in the ADC and other of the plurality of column signal processing circuits in the readout circuit 40, transfers the results in the horizontal direction, and outputs the same to a not shown signal processing circuit.

The timing control circuit 60 generates the timing signals which are necessary for the signal processing of the pixel portion 20, vertical scanning circuit 30, readout circuit 40, horizontal scanning circuit 50, and so on.

The configurations and functions of the different portions in the solid-state imaging device 10 were explained in brief above. Next, the configuration of the capacity changing portion 80 according to the first embodiment and the readout processing etc. related with this will be explained in detail.

In the first embodiment, the capacity changing portion 80 is configured by a MOS structure capacitor which is connected to the floating diffusion FD of each pixel PXL.

Figure 5A:
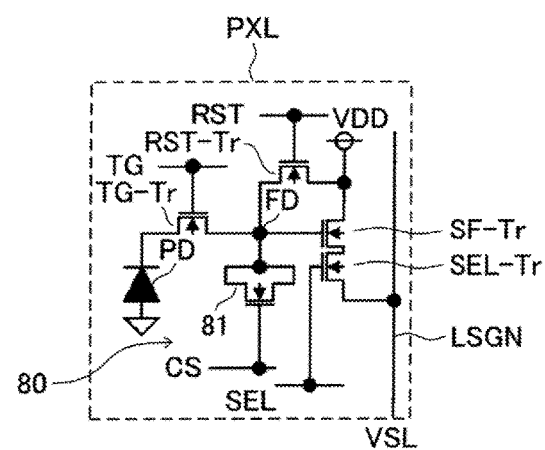
FIG. 5A and FIG. 5B are diagrams showing a first example of configuration of a MOS structure capacitor configuring a pixel and a capacity changing portion according to the first embodiment of the present invention.
Figure 5B:
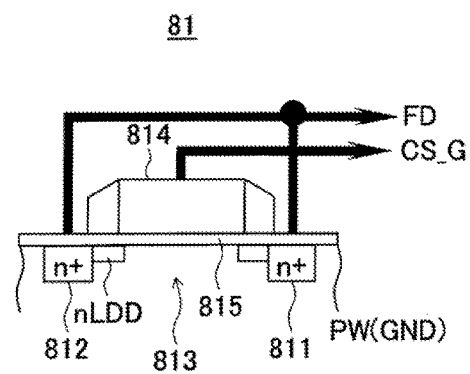

FIG. 5A and FIG. 5B are diagrams showing a first example of the configuration of the MOS structure capacitor which configures the pixel and capacity changing portion according to the first embodiment of the present invention. FIG. 5A shows an equivalent circuit of a pixel PXL including a MOS structure capacitor 81 of the first example of the configuration, and FIG. 5B simply shows the cross-sectional structure of the of MS structure capacitor 81 in the first example of the configuration.

In this DMS structure capacitor 81, a drain and a source of the MOS are connected, the connecting point thereof is connected to the floating diffusion FD, and a gate is connected to the supply line of the capacity changing signal CS.

In the MOS structure capacitor 81, the drain 811 and the source 812 are formed as for example n+ diffusion layers which are the first conductivity type on the two end sides of a channel forming region 813 of a semiconductor substrate. These n+ diffusion layers are connected to each other and are connected to the floating diffusion FD. Further, in the MS structure capacitor 81, the gate 814 is formed by polysilicon through a gate oxide film 815 on the channel forming region 813 of the semiconductor substrate. This gate 814 is connected to the supply line of the capacity changing signal CS.

Note that, the DDS structure capacitor 81 may be configured as a buried channel as well so as to improve the linearity.

In this first embodiment, by making the DS structure capacitor 81 function as a variable capacitance by switching the gate voltage of the MS structure capacitor 81 by the capacity changing signal CS, the dynamic range is extended. The processing of extending the dynamic range by making the MS structure capacitor 81 function as a variable capacitance by switching the gate voltage of the MOS structure capacitor 81 by the capacity changing signal CS is carried out in the readout scan period PRDO which was explained with reference to FIG. 3A and FIG. 3B. As explained before, the control line SEL is set at the H level in the readout scan period PRDO and the selection transistor SEL-Tr is held in the conductive state.

When the capacity changing signal CS is at a low level L, the capacity (charge quantity) of the floating diffusion FD is not changed. In this case, during the readout scan period PRDO, for example, in one readout period PRD1 from when the floating diffusion FD is reset through the reset element comprised of the reset transistor RST-Tr in the reset period PR up to when the transfer period PT is started, the readout portion 70 performs a high conversion gain mode reading operation HCG1 for reading out the pixel signal by a high conversion gain (first conversion gain) in accordance with the first capacity (the first capacity may be a capacity which is not changed by a default value) which is set by the MS structure capacitor 81 in the capacity changing portion 80. Alternatively, with the use of the readout portion 70, for example, in one readout period PRD2 (PRD3) after the accumulated charge in the photodiode PD is transferred to the floating diffusion FD through the transfer element comprised of the transfer transistor TG-Tr in the transfer period PT, the readout portion 70 performs a high conversion gain mode reading operation HCG2 for reading out the pixel signal by a high conversion gain (first conversion gain) in accordance with the first capacity set by the MOS structure capacitor 81 in the capacity changing portion 80.

When the capacity changing signal CS is at the H (high level), the capacity is changed so that the capacity (charge quantity) of the floating diffusion FD increases. In this case, during the readout scan period PRDO, for example, in one readout period PRD1 from when the floating diffusion FD is reset through the reset element comprised of the reset transistor RST-Tr in the reset period PR up to when the transfer period PT is started, the readout portion 70 performs a low conversion gain mode reading operation LCG1 for reading out the pixel signal by a low conversion gain (second conversion gain) in accordance with the second capacity (in accordance with the second capacity which is changed from the default first capacity) which is set by the MOS structure capacitor 81 in the capacity changing portion 80. Alternatively, with the use of the readout portion 70, for example, in one readout period PRD2 (PRD3) after the accumulated charge in the photodiode PD is transferred to the floating diffusion PD through the transfer element comprised of the transfer transistor TG-Tr in the transfer period PT, the readout portion 70 performs a low conversion gain mode reading operation LCG2 for reading out the pixel signal by a low conversion gain (second conversion gain) in accordance with the second capacity set by the MOS structure capacitor 81 in the capacity changing portion 80.

Further, for example, in the readout circuit 40 configuring a portion of the readout portion 70, a difference between the readout signal of the high conversion gain mode reading operation HCG2 and the readout signal of the high conversion gain mode reading operation HCG1 is taken, and CDS processing is carried out. In the sane way, a difference between the readout signal of the low conversion gain node reading operation LCG2 and the readout signal of the low conversion gain mode reading operation LCG1 is taken, and CDS processing is carried out.

In this way, the solid-state imaging device 10 in the first embodiment is realized as a solid-state imaging element having a wide dynamic range in which, with respect to the charge (electrons) which is generated by photo-electric conversion in one accumulation period (exposure period), inside the pixel, signals are output by switching the first conversion gain (for example high conversion gain) mode and the second conversion gain (low conversion gain) mode so both of a bright signal and the dark signal are output in one readout period.

Figure 6A:
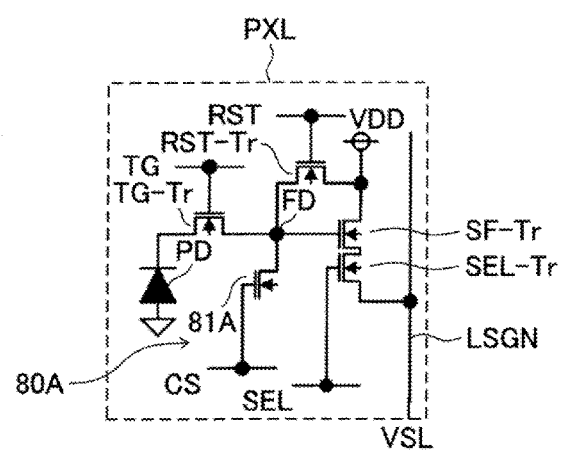
FIG. 6A and FIG. 6B are diagrams showing a second example of the configuration of a MOS structure capacitor configuring a pixel and a capacity changing portion according to the first embodiment of the present invention.
Figure 6B:
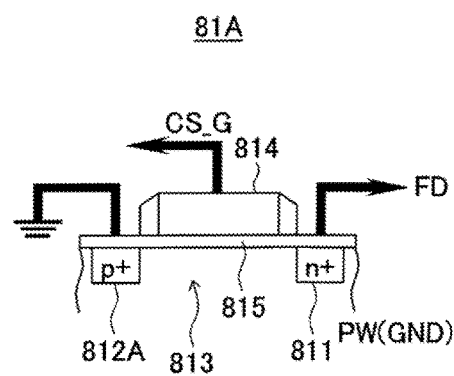

FIG. 6A and FIG. 6B are diagrams showing a second example of the configuration of the MOS structure capacitor configuring a pixel and capacity changing portion according to the first embodiment of the present invention. FIG. 6A shows an equivalent circuit of a pixel PXL including a MOS structure capacitor 81A of the second example of the configuration, and FIG. 6B simply shows the cross-sectional structure of the MOS structure capacitor 81A of the second example of the configuration.

The point of difference of this MOS structure capacitor 81A of the second example of the configuration from the MS structure capacitor 81 of the first example of the configuration which was explained above is as follows. In the MOS structure capacitor 81A of the second example of the configuration, only the region of the drain 811 of the n+ diffusion layer is connected to the floating diffusion FD, and a source 812A is formed as a second conductivity type p+ diffusion layer region.

In this way, by injecting p-type ions into a diffusion layer which is positioned at the distant side of the floating diffusion FD node, it becomes possible to reduce the remaining charge under the gate at the time of switching the gate voltage.

Next, the operation for realizing a wide dynamic range in a case where the MOS structure capacitor configuring the capacity changing portion according to the first embodiment is applied will be explained with reference to FIG. 7A to FIG. 7C.

FIG. 7A to FIG. 7C are diagrams for explaining the operation for realizing a wide dynamic range in a case where the MOS structure capacitor configuring the capacity changing portion according to the first embodiment is applied. FIG. 7A shows an example of a case where the MOS structure capacitor 81A of the second example of the configuration in FIG. 6B is applied as the MOS structure capacitor configuring the capacity changing portion. FIG. 7A shows an equivalent circuit of the pixel PXL, FIG. 7B shows a timing chart for explaining the operation, and FIG. 7C diagrammatically shows a transition of the potential of a principal part of the pixel PXL along with the elapse of time of operation.

Note that, in the present embodiment, the explanation will be given by assuming that between the first capacity and second capacity which are set by the capacity changing portion 80, the second capacity is larger than the first capacity. These values are relative ones. For facilitating understanding, they will be explained as the first capacity and second capacity also in the two periods which are after the reset period and after the transfer period.

During the readout scan period PRDO, as shown in FIG. 7B, in order to select one row in the pixel array, the control line SEL connected to each pixel PXL in that selected row is set at the H level and the selection transistor SEL-Tr of the pixel PXL becomes a conductive state. In this selection state, the reset transistor RST-Tr is selected in the reset period PR in the period where the control line RST is at the H level to become a conductive state, and the floating diffusion FD is reset to the potential of the power supply line VDD. The period from when this reset period PR passes (the reset transistor RST-Tr is in a nonconductive state) up to when the transfer period PT is started becomes the first readout period PRD1 for reading out the pixel signal at the time of the reset state.

At a time t1 after the first readout period PRD1 is started, the capacity changing signal CS is set at the L level, and the readout portion 70 performs the first high conversion gain mode reading operation HCG1 for reading out the pixel signal by a high conversion gain (first conversion gain) so that the capacity (charge quantity) of the floating diffusion FD is not changed from the first capacity. At this time, in each pixel PXL, due to the source-follower transistor SF-Tr, the charge in the floating diffusion FD is converted to a voltage signal in accordance with the charge quantity (potential). This is output as the readout signal VSL (HCG1) of column output to the vertical signal line LSGN, supplied to the readout circuit 40, and for example held.

In the first readout period PRD1, after the first high conversion gain mode reading operation HCG1 is carried out at the time t1, the capacity changing signal CS is switched to the H level and the capacity is changed so that the capacity (charge quantity) of the floating diffusion FD increases from the first capacity to the second capacity. Further, at a time t2, the readout portion 70 performs a first low conversion gain mode reading operation LCG1 for reading out the pixel signal by a low conversion gain (second conversion gain) by the change of the capacity (charge quantity) of the floating diffusion FD. At this time, in each pixel PXL, due to the source-follower transistor SF-Tr, the charge in the floating diffusion FD is converted to the voltage signal in accordance with the charge quantity (potential). This is output as the readout signal VSL (LCG1) of column output to the vertical signal line is, supplied to the readout circuit 40, and for example held.

Here, the first readout period PRD1 ends, and the transfer period PT starts. Note that, at this time, the capacity changing signal CS is held at the H level as it is in a predetermined period after the transfer period PT passes. In the transfer period PT, the transfer transistor TG-Tr is selected in the period where the control line TG is at the high level H and becomes a conductive state, and the charge (electrons) which is generated by photo-electric conversion and accumulated in the photodiode PD is transferred to the floating diffusion D. After this transfer period PT passes (the transfer transistor TG-Tr is in the nonconductive state), the second readout period PRD2 for reading out the pixel signal in accordance with the charge which is generated by photo-electric conversion and accumulated in the photodiode PD starts.

At a time t3 after the second readout period PRD2 is started, in the state where the capacity changing signal CS is set at the H level, the readout portion 70 performs a second low conversion gain mode reading operation LCG2 for reading out the pixel signal by a low conversion gain (second conversion gain) by the change of the capacity (charge quantity) of the floating diffusion FD. At this time, in each pixel PXL, due to the source-follower transistor SF-Tr, the charge in the floating diffusion FD is converted to a voltage signal in accordance with the charge quantity (potential). This is output as the readout signal VSL (LCG2) of column output to the vertical signal line LSGN, supplied to the readout circuit 40, and for example held.

In the second readout period PRD2, after the second low conversion gain mode reading operation LCG2 is carried out at the time t3, the capacity changing signal CS is switched to the L level to change the capacity so that the capacity (charge quantity) of the floating diffusion FD is reduced from the second capacity to the first capacity. Further, at a time t4, the readout portion 70 performs a second high conversion gain mode reading operation HCG2 for reading out the pixel signal by a high conversion gain (first conversion gain) by the change so that the capacity (charge quantity) of the floating diffusion FD becomes low. At this time, in each pixel PXL, due to the source-follower transistor SF-Tr, the charge in the floating diffusion FD is converted to a voltage signal in accordance with the charge quantity (potential). This is output as the readout signal VSL (HCG2) of column output to the vertical signal line LSGN, supplied to the readout circuit 40, and for example held.

Further, in for example the readout circuit 40 configuring a portion of the readout portion 70, a difference {VSL (HCG2)−VSL(HCG1)} between the readout signal VSL (HCG2) of the second high conversion gain node reading operation HCG2 and the readout signal VSL (HCG1) of the first high conversion gain node reading operation HCG1 is taken, and CDS processing is carried out. In the same way, in the readout circuit 40, a difference {VSL(LCG2)−VSL (LCG1)} between the readout signal VSL (LCG2) of the second low conversion gain made reading operation LCG2 and the readout signal VSL (FIG. 1) of the first low conversion gain mode reading operation LCG1 is taken, and CDS processing is carried out.

In this way, the solid-state imaging device 10 in the first embodiment realizes a wide dynamic range of outputting signals by switching the high conversion gain (first conversion gain) mode and the low conversion gain (second conversion gain) ode and outputting both of a bright signal and a dark signal in one readout period inside the pixel with respect to the charge (electrons) which is generated by photo-electric conversion in one accumulation period (exposure period).

As explained above, according to the first embodiment, the capacity of the floating diffusion FD is changed by the capacity changing portion 80 (80A) configured by the MOS structure capacitor 81 (81A) in a predetermined period in one readout period of charge, and the conversion gain is switched in this readout period. Further, the readout portion 70, in one readout period, performs the high conversion gain (first conversion gain) mode reading operation for reading out the pixel signal by high conversion gain (first conversion gain) in accordance with the first capacity which is set by the capacity changing portion 80 (80A), and the low conversion gain (second conversion gain) mode reading operation for reading out the pixel signal by the low conversion gain (second conversion gain) in accordance with the second capacity which is set by the capacity changing portion 80 (80A).

Accordingly, according to the first embodiment, with respect to the charge (electrons) which is generated by photo-electric conversion in one accumulation period (exposure period), inside the pixel, signals are output by switching the high conversion gain mode and the low conversion gain mode so both of a bright signal and dark signal can be output in one readout period, a reset noise at the time of high conversion gain mode and low conversion gain mode can be cancelled, a dynamic range widening can be realized while suppressing occurrence of motion distortion, and consequently a higher image quality can be realized.

Second Embodiment

Figure 8:
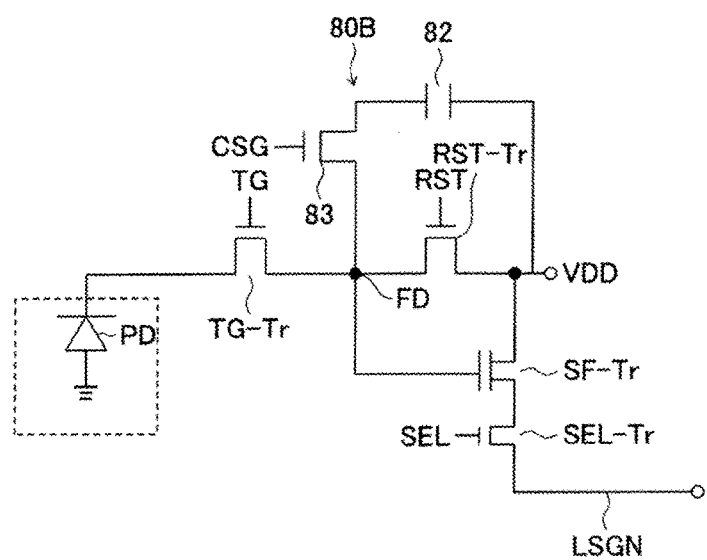
FIG. 8 is a diagram showing an example of the configuration of a pixel and capacity changing portion according to a second embodiment of the present invention.

FIG. 8 is a diagram showing an example of the configuration of a pixel and a capacity changing portion according to a second embodiment of the present invention.

The difference of a capacity changing portion 80B in the second embodiment from the capacity changing portion 80 in the first embodiment resides in that, in place of the configuration by the MOS structure capacitor, it is configured by a capacitor 82 and a switch comprised of a switching transistor 83 which is connected between the capacitor 82 and the floating diffusion FD and is turned ON or OFF in accordance with the capacity changing signal CSG.

Next, the operation for realizing a wide dynamic range in a case where the capacitor and switch are applied to the capacity changing portion according to the second embodiment will be explained with reference to FIG. 9A to FIG. 9D.

FIG. 9A to FIG. 9D are diagrams for explaining the operation for realizing a wide dynamic range in a case where the capacitor and switch are applied to the capacity changing portion according to the second embodiment. FIG. 9A shows an equivalent circuit of the pixel PXL, FIG. 9B shows a timing chart for explaining the operation, FIG. 9C diagrammatically shows the transition of the potential of the principal part of the pixel PXL along with the elapse of time of the operation, and FIG. 9D shows the relationship between the illuminance and the CDS output.

During the readout scan period PRDO, as shown in FIG. 9B, in order to select one row in the pixel array, the control line SEL connected to each pixel PXL in that selected row is set at an H level and the selection transistor SEL-Tr of the pixel PXL becomes a conductive state. In this selection state, the reset transistor RST-Tr is selected in the reset period PR in the period where the control line RST is at the H level to became a conductive state, and the floating diffusion FD is reset to the potential of the power supply line VDD. The period after this reset period PR passes (the reset transistor RST-Tr is in a nonconductive state) and up to when the transfer period PT is started becomes a first readout period PRD11 for reading out the pixel signal at the time of the reset state. Substantially parallel to the start of the reset period PR, the capacity changing signal CSG is switched to the H level, and the capacity is changed so that the capacity (charge quantity) of the floating diffusion FD increases frau the first capacity to the second capacity.

At the time t1 after the first readout period PRD11 is started, in the state where the capacity changing signal CSG is held at the H level, the readout portion 70 performs a first low conversion gain mode reading operation LCG11 for reading out the pixel signal by a low conversion gain (second conversion gain) by the change of the capacity (charge quantity) of the floating diffusion FD to the second capacity. At this time, in each pixel PXL, due to the source-follower transistor SF-Tr, the charge in the floating diffusion FD is converted to a voltage signal in accordance with the charge quantity (potential). This is output as the readout signal VSL (LCG11) of column output to the vertical signal line LSGN, supplied to the readout circuit 40, and for example held.

In the first readout period PRD11, after the first low conversion gain mode reading operation LCG11 is carried out at the time t1, the capacity changing signal CSG is switched to the L level, and the capacity is changed so that the capacity (charge quantity) of the floating diffusion FD is reduced from the second capacity to the first capacity. Further, at the time t2, the readout portion 70 performs a first high conversion gain mode reading operation HCG11 for reading out the pixel signal by a high conversion gain (first conversion gain) by the change of the capacity (charge quantity) of the floating diffusion FD. At this time, in each pixel PXL, due to the source-follower transistor SF-Tr, the charge in the floating diffusion. FD is converted to a voltage signal in accordance with the charge quantity (potential). This is output as the readout signal VSL (HCG11) of column output to the vertical signal line LSGN, supplied to the readout circuit 40, and for example held.

Here, the first readout period PRD11 ends, and the first transfer period PT11 starts. Note that, at this time, the capacity changing signal CSG is held at the L level as it is in a predetermined period after the first transfer period PT11 passes to substantially the time immediately before the start of the next second transfer period PT12. In the first transfer period PT11, the transfer transistor TG-Tr is selected to become a conductive state in the period where the control line TG is at the H level, and the charge (electrons) which is generated by photo-electric conversion and accumulated in the photodiode PD is transferred to the floating diffusion FD. After this first transfer period PT passes (the transfer transistor TG-Tr is in a nonconductive state), the second readout period PRD12 for reading out the pixel signal in accordance with the charge which is generated by photo-electric conversion and accumulated in the photodiode PD starts.

At the time t3 after the second readout period PRD12 is started, in the state where the capacity changing signal CSG is set at the L level, the readout portion 70 performs the second high conversion gain mode reading operation HCG12 for reading out the pixel signal by a high conversion gain (first conversion gain) in the case where the capacity (charge quantity) of the floating diffusion FD is set at the first capacity. At this time, in each pixel PXL, due to the source-follower transistor SF-Tr, the charge in the floating diffusion FD is converted to a voltage signal in accordance with the charge quantity (potential). This is output as the readout signal VSL (HCG12) of column output to the vertical signal line LSGN, supplied to the readout circuit 40, and for example held.

In the second readout period PRD12, after the second high conversion gain mode reading operation HCG12 is carried out at the time t3, the capacity changing signal CSG is switched to the H level, and the capacity is changed so that the capacity (charge quantity) of the floating diffusion FD increases from the first capacity to the second capacity. Substantially parallel to this capacity change, the second transfer period PT12 starts. Note that, at this time, the capacity changing signal CSG is held at the H level as it is after the second transfer period PT12 passes up to when the control line SEL is switched to the L level. In the second transfer period PT12, the transfer transistor TG-Tr is selected and becomes a conductive state for the period where the control line TG is at the H level, and the charge (electrons) which is generated by photo-electric conversion and accumulated in the photodiode FD is transferred to the floating diffusion D. After this second transfer period PT12 passes (the transfer transistor TG-Tr is in a nonconductive state), a third readout period PRD13 for further reading out the pixel signal in accordance with the charge which is generated by photo-electric conversion and accumulated in the photodiode PD starts.

At a time t4 after the third readout period PRD13 is started, in the state where the capacity changing signal CSG is held at the H level, the readout portion 70 performs the second low conversion gain mode reading operation LCG12 for reading out the pixel signal by a low conversion gain (second conversion gain) in the case where the capacity (charge quantity) of the floating diffusion FD is set at the second capacity. At is set at the second capacity. At this time, in each pixel PXL, due to the source-follower transistor SF-Tr, the charge in the floating diffusion FD is converted to a voltage signal in accordance with the charge quantity (potential). This is output as the readout signal VSL (LCG12) of column output to the vertical signal line LSGN, supplied to the readout circuit 40, and for example held.

Further, for example, in the readout circuit 40 configuring a portion of the readout portion 70, a difference {VSL (HCG12)–VSL(HCG11)} between the readout signal VSL (HCG12) of the second high conversion gain mode reading operation HCG12 and the readout signal VSL (HCG11) of the first high conversion gain mode reading operation HCG11 is taken, and CDS processing is carried out. In the same way, in the readout circuit 40, a difference {VSL (LCG12)–VSL(LCG11)} between the readout signal VSL (LCG12) of the second low conversion gain mode reading operation LCG12 and the readout signal VSL (LCG11) of the first low conversion gain node reading operation LCG11 is taken, and CDS processing is carried out.

According to the second embodiment, the same effects as those by the first embodiment explained above can be obtained. That is, according to the second embodiment, the following effects can be obtained: With respect to the charge (electrons) which is generated by photo-electric conversion in one accumulation period (exposure period), inside the pixel, in one readout period, signals are output by switching the high conversion gain mode and the low conversion gain node so both of the bright signal and dark signal can be output, a reset noise at the time of high conversion gain node and low conversion gain node can be cancelled, dynamic range widening can be realized while suppressing occurrence of notion distortion, and consequently a higher image quality can be realized.

Further, according to the second embodiment, the readout portion 70, during the readout scan period PRDO, sets a plurality of (two in the present example) transfer periods for performing transfer processing and performs the processing of reading out the signal in accordance with the accumulated charge in each readout period after each transfer period, therefore it becomes possible to reliably realize a further widening of dynamic range. Further, according to the second embodiment, the readout portion 70, in at least one transfer period (the transfer period on the latter stage side in the present example) among the plurality of transfer periods, transfers the accumulated charge from the photo-electric conversion element PD in a state where the capacity of the floating diffusion is made large by the capacity changing portion, therefore it becomes possible to reduce an overflowing charge, the accumulated charge can be effectively utilized, and consequently a higher image quality can be realized.

Third Embodiment

Figure 10:
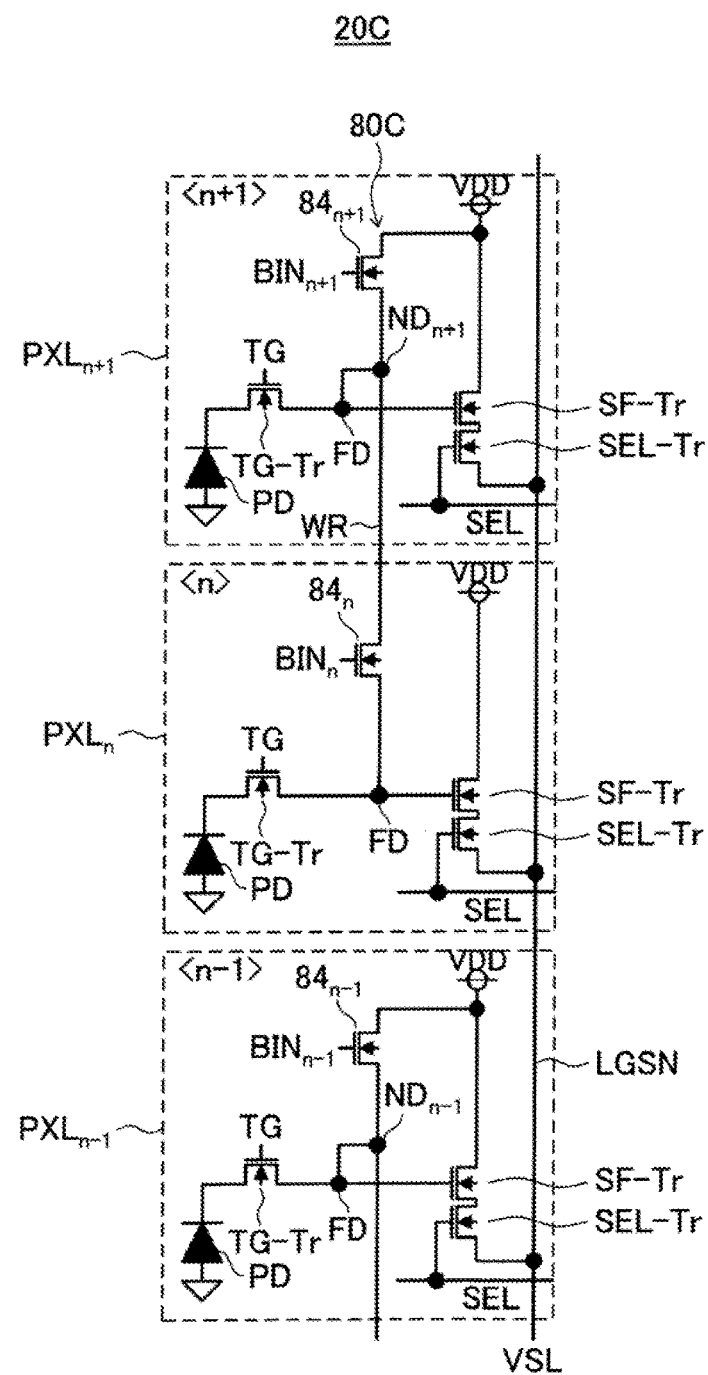
FIG. 10 is a diagram showing an example of the configuration of a pixel portion and capacity changing portion according to a third embodiment of the present invention.

FIG. 10 is a diagram showing an example of the configuration of a pixel portion and capacity changing portion according to a third embodiment of the present invention.

The difference of a capacity changing portion 80C in the third embodiment from the capacity changing portion 80 in the first and second embodiments is as follows. In the first and second embodiments, the capacity changing portion is configured by the MOS structure capacitor, switch, and capacitor.

Contrary to this, in the third embodiment, the capacity changing portion 80C is configured by not a capacitor, but a first binning switch $84_n$ which is connected to (arranged in) wiring WR formed between the floating diffusions FD of two pixels $PXL_n$ and $PXL_{n+1}$ which are adjacent in the column output direction and a first binning switch $84_{n+1}$ which is connected between the floating diffusion FD of the pixel $PXL_{n+1}$ and the power supply line VDD. In the third embodiment, by turning on/off the first binning switches $84_n$ and $84_{n+1}$ by capacity changing signals $BIN_n$ and $BIN_{n+1}$, the number of the floating diffusions FD to be connected is switched to one or two or two or ore (two in the present example) to thereby change the capacity of the floating diffusion FD of the readout target pixel and switch the conversion gain of the floating diffusion FD of the pixel $PXL_n$ or $PXL_{n+1}$ to be read out.

In other words, in the third embodiment, the reset element is shared by the two adjacent pixels $PXL_n$ and $PXL_{n+1}$ in one column, the floating diffusion FD of the pixel $PXL_n$ and the power supply line VDD are connected to each other through the first binning switches $84_n$ and $84_{n+1}$ which are formed so as to be cascade connected to the wiring WR, and a connection node $ND_{n+1}$ on the wiring WR between the first binning switches $84_n$ and $84_{n+1}$ and the floating diffusion FD of the pixel $PXL_{n+1}$ are connected. In the third embodiment, the first binning switch $84_{n+1}$ functions as the shared reset element.

In the present embodiment, the first binning switch 84 ( . . . , n−1, n, n+1, . . . ) is for example formed by an n-channel MOS (NMOS) transistor. In the following explanation, the binning switch will be sometimes called a "binning transistor" as well.

By providing the first binning switches $84_n$ and $84_{n+1}$ in this way, the capacitor and reset transistor become unnecessary for the pixels $PXL_n$ and $PXL_{n+1}$, the number of transistors in a pixel can be decreased, an aperture ratio of the photodiode PD is high, and the photo-electric conversion sensitivity and number of saturated electrons can be raised. In the third embodiment, the first binning switches $84_n$ and $84_{n+1}$ have the function as a reset element together. Further, all of plurality of (two in the present example) pixels connected through the first binning switches $84_n$ and $84_{n+1}$ share the reset element by the first binning switch $84_{n+1}$ which discharges the charge in the floating diffusion FD in the reset period PR.

In the third embodiment, by making the capacity changing signal $BIN_{n+1}$ corresponding to the readout pixel $PXL_{n+1}$ an L level, this is rendered a non-reset state.

In this way, in the third embodiment, pixels are provided where two pixels of one column share a reset element. Therefore, at the time of resetting the floating diffusion FD, a resistance between the floating diffusion FD and the reset electrode is low, so an excellent speed is achieved in the reset operation.

Next, an operation for realizing a wide dynamic range where a binning switch (binning transistor) is applied to the capacity changing portion according to the third embodiment will be explained with reference to FIG. 11.

Figure 11:
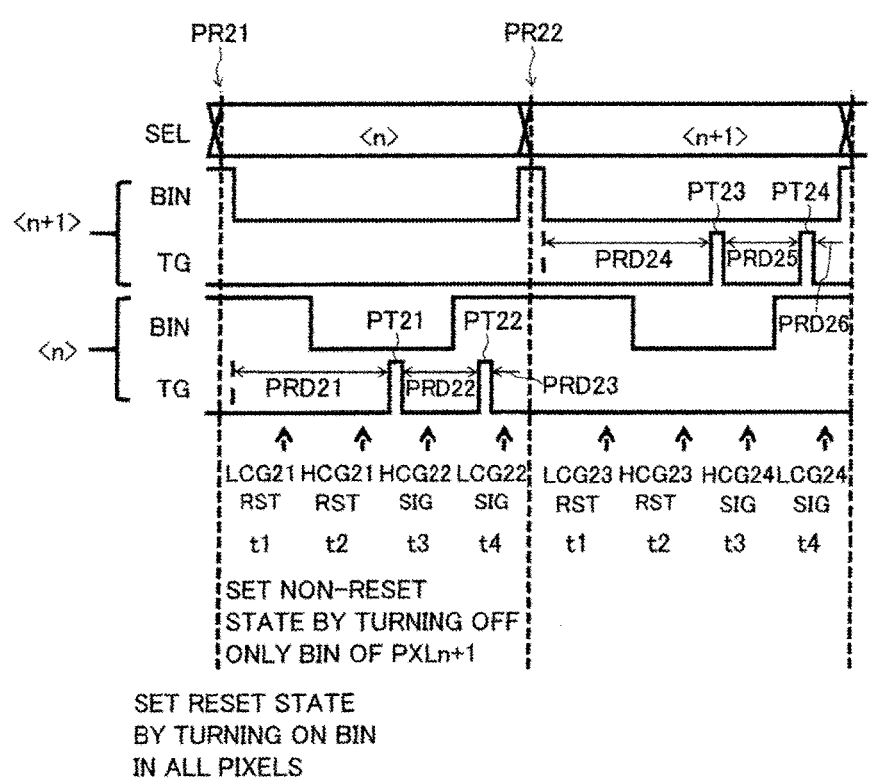
FIG. 11 is a timing chart for explaining the operation for realizing a wide dynamic range in a case where a binning switch is applied to the capacity changing portion according to the third embodiment.

FIG. 11 is a timing chart for explaining the operation for realizing a wide dynamic range where a binning switch (binning transistor) is applied to the capacity changing portion according to the third embodiment.

During the readout scan period PRDO, as shown in FIG. 11, in order to select one row in the pixel array, for example, the n-th row, the control line SEL connected to each pixel $PXL_n$ in that selected row is set at the H level and the selection transistor SEL-Tr in the pixel $PXL_n$ becomes a conductive state. In this selection state, in the reset period PR21, all first binning transistors $84_n$, $84_{n+1}$ ($84_{n-1}$ . . . ) are selected and become a conductive state in a period where the capacity changing signals $BIN_n$ and $BIN_{n+1}$ are at the H level as the reset signals, and the floating diffusions FD are reset to the potential of the power supply line VDD. After this reset period PR21 passes, the capacity changing signal $BIN_{n+1}$ is switched to the L level and the first binning transistor $84_{n+1}$ is switched to a nonconductive state. On the other hand, the capacity changing signal $BIN_n$ is held at the H level as it is, and the first binning transistor $84_n$ is held in the conductive state. The reset period PR21 ends by the first binning transistor $84_{n+1}$ being switched to the nonconductive state and the first binning transistor $84_n$ being held in the conductive state, and the capacity (charge quantity) of the floating diffusion FD of the pixel $PXL_n$ is changed so as to increase from the first capacity to the second capacity. Further, the period up to the start of the transfer period PT21 becomes the first readout period PRD21 for reading out the pixel signal at the time of the reset state.

At the time t1 after the first readout period PRD21 is started, in the state where the capacity changing signal $BIN_n$ is held at the H level, the readout portion 70 performs a first low conversion gain mode reading operation LCG21 for reading out the pixel signal by a low conversion gain (second conversion gain) by the change of the capacity (charge quantity) of the floating diffusion FD to the second capacity. At this time, in each pixel $PXL_n$, due to the source-follower transistor SF-Tr, the charge in the floating diffusion FD is converted to a voltage signal in accordance with the charge quantity (potential). This is output as the readout signal VSL (LCG21) of column output to the vertical signal line LSGN, supplied to the readout circuit 40, and for example held.

In the first readout period PRD21, after the first low conversion gain mode reading operation LCG21 is carried out at the time t1, the capacity changing signal $BIN_n$ is switched to the L level, and the capacity (charge quantity) of the floating diffusion FD is changed so as to decrease from the second capacity to the first capacity. Further, at the time t2, the readout portion 70 performs a first high conversion gain mode reading operation HCG21 for reading out the pixel signal by a high conversion gain (first conversion gain) by the change of the capacity (charge quantity) of the floating diffusion FD. At this time, in each pixel $PXL_n$, due to the source-follower transistor SF-Tr, the charge in the floating diffusion FD is converted to a voltage signal in accordance with the charge quantity (potential). This is output as the readout signal VSL (HCG21) of column output to the vertical signal line LSGN, supplied to the readout circuit 40, and for example held.

Here, the first readout period PRD21 ends, and the first transfer period PT21 starts. Note that, at this time, the capacity changing signal $BIN_n$ is held at the L level as it is in a predetermined period after the first transfer period PT21 passes up to substantially the time immediately before the start of the next second transfer period PT22. In the first transfer period PT21, the transfer transistor TG-Tr is selected and becomes a conductive state for the period where the control line TG is at the H level, and the charge (electrons) which is generated by photo-electric conversion and accumulated in the photodiode PD is transferred to the floating diffusion FD. After this first transfer period PT21 passes (the transfer transistor TG-Tr is in a nonconductive state), the second readout period PRD22 for reading out the pixel signal in accordance with the charge which is generated by photo-electric conversion and accumulated in the photodiode PD starts.

At the time t3 after the second readout period PRD22 is started, in the state where the capacity changing signal $BIN_n$ is set at the L level, the readout portion 70 performs a second high conversion gain mode reading operation HCG22 for reading out the pixel signal by a high conversion gain (first conversion gain) resulting from the capacity (charge quantity) of the floating diffusion FD being set to the first capacity. At this time, in each pixel $PXL_n$, due to the source-follower transistor SF-Tr, the charge in the floating diffusion FD is converted to a voltage signal in accordance with the charge quantity (potential). This is output as the readout signal VSL (HCG22) of column output to the vertical signal line LSGN, supplied to the readout circuit 40, and for example held.

In the second readout period PRD22, after the second high conversion gain mode reading operation HCG22 is carried out at the time t3, the capacity changing signal $BIN_n$ is switched to the H level, and the capacity (charge quantity) of the floating diffusion FD is changed so as to increase from the first capacity to the second capacity. Substantially parallel to this capacity change, the second transfer period PT22 starts. Note that, at this time, the capacity changing signal $BIN_n$ is held at the H level at the H level as it is even after the second transfer period PT22 passes. In the second transfer period PT22, the transfer transistor TG-Tr is selected and becomes a conductive state for the period where the control line TG is at the H level, and the charge (electrons) which is generated by photo-electric conversion and accumulated in the photodiode PD is transferred to the floating diffusion FD. After this second transfer period PT22 passes (the transfer transistor TG-Tr is in the nonconductive state), a third readout period readout period PRD23 for further reading out the pixel signal in accordance with the charge which is generated by photo-electric conversion and accumulated in the photodiode PD starts.

At a time t4 after the third readout period PRD23 is started, in the state where the capacity changing signal $BIN_n$ is held at the H level, the readout portion 70 performs the second low conversion gain mode reading operation LCG22 for reading out the pixel signal by a low conversion gain (second conversion gain) resulting from the capacity (charge quantity) of the floating diffusion FD being set to the second capacity. At this time, in each pixel $PXL_n$, due to the source-follower transistor SF-Tr, the charge in the floating diffusion FD is converted to a voltage signal in accordance with the charge quantity (potential). This is output as the readout signal VSL (LCG22) of column output to the vertical signal line LSGN, supplied to the readout circuit 40, and for example held.

Further, in for example the readout circuit 40 configuring a portion of the readout portion 70, a difference {VSL (HCG22)–VSL (HCG21)} between the readout signal VSL (HCG22) of the second high conversion gain mode reading operation HCG22 and the readout signal VSL (HCG21) of the first high conversion gain mode reading operation HCG21 is taken, and CDS processing is carried out. In the same way, in the readout circuit 40, a difference {VSL (LCG22)–VSL (LCG21)} between the readout signal VSL (LCG22) of the second low conversion gain mode reading operation LCG22 and the readout signal VSL (LCG21) of the first low conversion gain mode reading operation LCG21 is taken, and CDS processing is carried out.

Next, as shown in FIG. 11, in order to select the row next to the n-th row in the pixel array, for example the n+1-th row, in place of the n-th row, the control line SEL which is connected to each pixel $PXL_{n+1}$ in that selected n+1-th row is set at the H level and the selection transistor SEL-Tr of the pixel $PXL_{n+1}$ becomes a conductive state. At this time, the capacity changing signal $BIN_n$ is held at the H level as it is at the time of access to the n-th row. Further, in this selection state, in the reset period PR22, all first binning transistors $84_n$, $84_{n+1}$ ($84_{n-1}$ ... ) are selected and become the conductive state for the period where the capacity changing signals $BIN_n$ and $BIN_{n+1}$ are at the H level as the reset signals, and the floating diffusions D are reset to the potential of the power supply line VDD. After this reset period PR22 passes, the capacity changing signal $BIN_{n+1}$ is switched to the L level and the first binning transistor $84_{n+1}$ is switched to the nonconductive state. On the other hand, the capacity changing signal $BIN_n$ is held at the H level as it is, and the first binning transistor $84_n$ is held in the conductive state. The reset period PR22 ends by the first binning transistor $84_{n+1}$ being switched to the nonconductive state and the first binning transistor $84_n$ being held in the conductive state, and the capacity (charge quantity) of the floating diffusion FD in the pixel $PXL_{n+1}$ is changed so as to increase from the first capacity to the second capacity. Further, the period up to the start of the transfer period PT23 becomes a first readout period PRD24 for reading out the pixel signal at the time of the reset state.

At the time t1 after the first readout period PRD24 is started, in the state where the capacity changing signal BIN is held at the H level, the readout portion 70 performs the first low conversion gain mode reading operation LCG23 for reading out the pixel signal by a low conversion gain (second conversion gain) resulting from the capacity (charge quantity) of the floating diffusion FD being changed to the second capacity. At this time, in each pixel $PXL_{n+1}$, due to the source-follower transistor SF-Tr, the charge in the floating diffusion FD is converted to a voltage signal in accordance with the charge quantity (potential). This is output as the readout signal VSL (LCG23) of column output to the vertical signal line LSGN, supplied to the readout circuit 40, and for example held.

In the first readout period PRD24, after the first low conversion gain mode reading operation LCG23 is carried out at the time t1, the capacity changing signal $BIN_n$ is switched to the L (low level), and the capacity (charge quantity) of the floating diffusion FD is changed so as to decrease from the second capacity to the first capacity. Further, at the time t2, the readout portion 70 performs a first high conversion gain mode reading operation HCG23 for reading out the pixel signal by a high conversion gain (first conversion gain) by the change of the capacity (charge quantity) of the floating diffusion FD. At this time, in each pixel $PXL_{n+1}$, due to the source-follower transistor SF-Tr, the charge in the floating diffusion FD is converted to a voltage signal in accordance with the charge quantity (potential). This is output as the readout signal VSL (HCG23) of column output to the vertical signal line LSGN, supplied to the readout circuit 40, and for example held.

Here, the first readout period PRD24 ends, and the first transfer period PT23 starts. Note that, at this time, the capacity changing signal $BIN_n$ is held at the L level as it is in a predetermined period after the first transfer period PT23 passes up to substantially the time immediately before the start of the next second transfer period PT24. In the first transfer period PT23, the transfer transistor TG-Tr is selected and becomes a conductive state for the period where the control line TG is at the high level (H), and the charge (electrons) which is generated by photo-electric conversion and accumulated in the photodiode PD is transferred to the floating diffusion FD. After this first transfer period PT23 passes (the transfer transistor TG-Tr is in a nonconductive state), a second readout period PRD25 for reading out the pixel signal in accordance with the charge which is generated by photo-electric conversion and accumulated in the photodiode PD starts.

At the time t3 after the second readout period PRD25 is started, in the state where the capacity changing signal $BIN_n$ is set at the L level, the readout portion 70 performs a second high conversion gain mode reading operation HCG24 for reading out the pixel signal by a high conversion gain (first conversion gain) resulting from the capacity (charge quantity) of the floating diffusion FD being set to the first capacity. At this time, in each pixel $PXL_{n+1}$, due to the source-follower transistor SF-Tr, the charge in the floating diffusion FD is converted to a voltage signal in accordance with the charge quantity (potential). This is output as the readout signal VSL (HCG24) of column output to the vertical signal line LSGN, supplied to the readout circuit 40, and for example held.

In the second readout period PRD25, after the second high conversion gain mode reading operation HCG24 is carried out at the time U, the capacity changing signal $BIN_n$ is switched to the H level, and the capacity (charge quantity) of the floating diffusion FD is changed so as to increase from the first capacity to the second capacity. Substantially parallel to this capacity change, the second transfer period PT24 starts. Note that, at this time, the capacity changing signal $BIN_n$ is held at the H level as it is even after the second transfer period PT24 passes. In the second transfer period PT24, the transfer transistor TG-Tr is selected and becomes a conductive state for the period where the control line TG is at the high level (H), and the charge (electrons) which is generated by photo-electric conversion and accumulated in the photodiode PD is transferred to the floating diffusion FD. After this second transfer period PT24 passes (the transfer transistor TG-Tr is in the nonconductive state), a third readout period PRD26 for further reading out the pixel signal in accordance with the charge which is generated by photo-electric conversion and accumulated in the photodiode PD starts.

At the time t4 after the third readout period PRD26 is started, in the state where the capacity changing signal $BIN_n$ is held at the H level, the readout portion 70 performs the second low conversion gain mode reading operation LCG24 for reading out the pixel signal by a low conversion gain (second conversion gain) resulting from the capacity (charge quantity) of the floating diffusion FD being set to the second capacity. At this time, in each pixel $PXL_{n+1}$, due to the source-follower transistor SF-Tr, the charge in the floating diffusion FD is converted to a voltage signal in accordance with the charge quantity (potential). This is output as the readout signal VSL (LCG24) of column output to the vertical signal line LSGN, supplied to the readout circuit 40, and for example held.

Further, in for example the readout circuit 40 configuring a portion of the readout portion 70, a difference {VSL (HCG24)−VSL(HCG23)} between the readout signal VSL (HCG24) of the second high conversion gain mode reading operation HCG24 and the readout signal VSL (HCG23) of the first high conversion gain mode reading operation HCG23 is taken, and CDS processing is carried out. In the same way, in the readout circuit 40, a difference {VSL (LCG24)−VSL(LCG23)} between the readout signal VSL (LCG24) of the second low conversion gain mode reading operation LCG24 and the readout signal VSL (LCG23) of the first low conversion gain mode reading operation LCG23 is taken, and CDS processing is carried out.

According to the third embodiment, effects the same as those by the first and second embodiments explained above can be obtained. That is, according to the third embodiment, the following effects can be obtained: With respect to the charge (electrons) which is generated by photo-electric conversion in one accumulation period (exposure period), inside the pixel, in one readout period, signals are output by switching the high conversion gain mode and the low conversion gain mode so both of the bright signal and dark signal can be output, a reset noise at the time of high conversion gain mode and low conversion gain mode can be cancelled, dynamic range widening can be realized while suppressing occurrence of motion distortion, and consequently a higher image quality can be realized.

Further, according to the third embodiment, it is possible to flexibly switch the number of connections of the floating diffusions FD, so the expandability of the dynamic range is excellent. Further, the number of transistors inside a pixel is small, therefore the aperture ratio of the PD is high, and the photo-electric conversion sensitivity and the number of saturated electrons can be raised. Further, according to the third embodiment, provision is made of pixels where a reset element is shared by two pixels in one column. Therefore, at the time of reset of the floating diffusion FD, the resistance between the floating diffusion FD and the reset electrode is low, so there is the advantage of excellent speed in the reset operation.

Further, according to the third embodiment, the readout portion 70, during the readout scan period PRDO, sets a plurality of (two in the present example) transfer periods for performing the transfer processing and performs processing of reading out the signal in accordance with the accumulated charge in each readout period after each transfer period, therefore it becomes possible to reliably realize further widening of dynamic rang. Further, according to the third embodiment, the readout portion 70, in at least one transfer period (transfer period on the latter stage side in the present example) among the plurality of transfer periods, transfers the accumulated charge from a the photo-electric conversion element PD in a state where the capacity of the floating diffusion is made large by the capacity changing portion, therefore it becomes possible to reduce an overflowing charge, the accumulated charge can be effectively utilized, and consequently a higher image quality can be realized.

Fourth Embodiment

Figure 12:
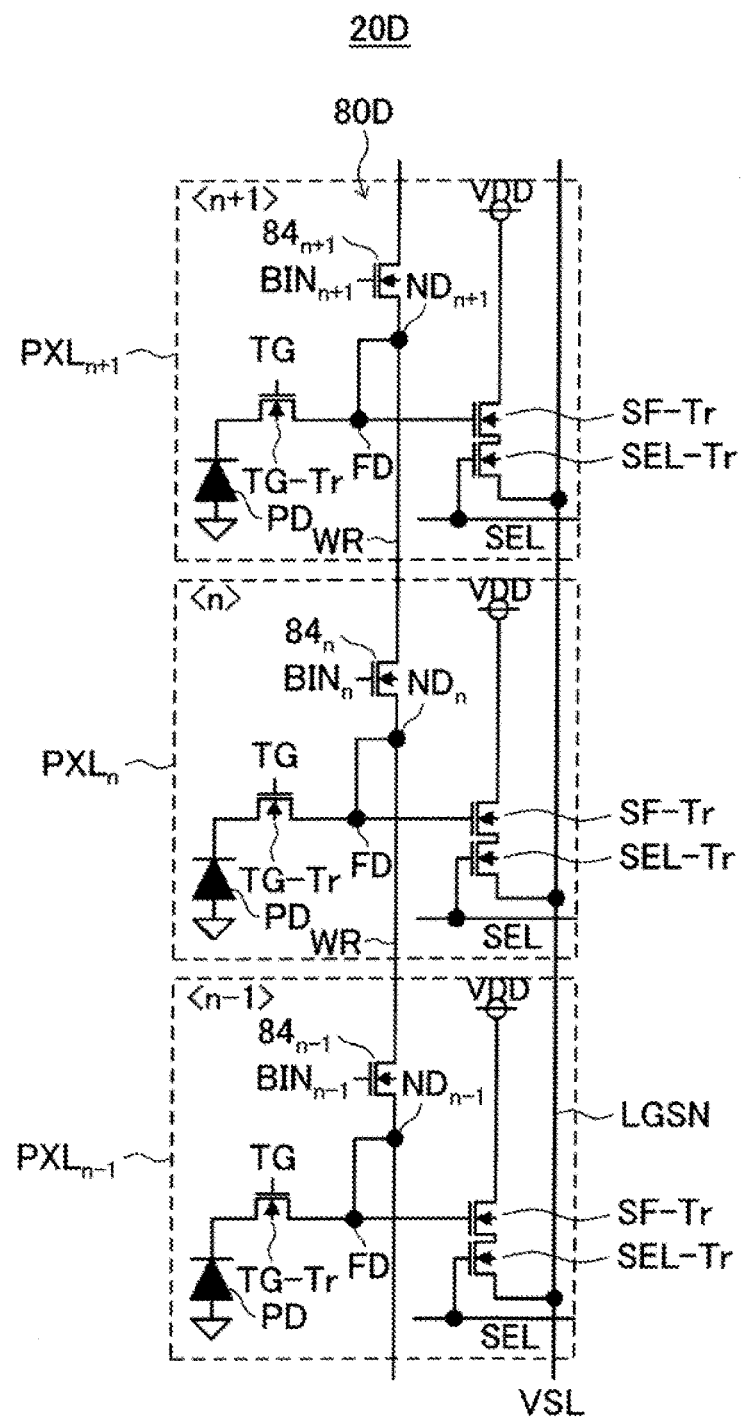
FIG. 12 is a diagram showing an example of the configuration of a pixel portion and capacity changing portion according to a fourth embodiment of the present invention.

FIG. 12 is a diagram showing an example of the configuration of a pixel portion and capacity changing portion according to a fourth embodiment of the present invention.

The difference of a capacity changing portion 80D in the fourth embodiment from the capacity changing portion 80C in the third embodiment is as follows.

In the third embodiment described above, the reset element is shared by the two adjacent pixels $PXL_n$ and $PXL_{n+1}$ in one column, the floating diffusion FD in the pixel $PXL_n$ and the power supply line VDD are connected to each other through the first binning transistors (switches) $84_n$ and $84_{n+1}$ which are formed so as to be cascade connected to the wiring WR, and the connection node $ND_{n+1}$ of the first binning transistors (switches) $84_n$ and $84_{n+1}$ which is located on the wiring WR and the floating diffusion FD in the pixel $PXL_{n+1}$ are connected. In the third embodiment, the first binning transistor (switch) $84_{n+1}$ functions as the shared reset element.

Contrary to this, in the fourth embodiment, the reset element is shared by all pixels . . . $PXL_{n-1}$, $PXL_n$, $PXL_{n+1}$ . . . in one column, for example the floating diffusion FD in a pixel $PXL_0$ (not shown in FIG. 12) on one end of one column and the power supply line VDD (not shown in FIG. 12) which is formed close to a pixel $PXL_{n-1}$ on the other end of one column are connected to each other through the first binning transistors (switches) . . . $84_{n-1}$, $84_n$, $84_{n+1}$ . . . which are formed so as to be cascade connected to the wiring WR while corresponding to the pixels, and nodes . . . $ND_{n-1}$, $ND_n$, $ND_{n+1}$ . . . on the wiring WR among the first binning switches and the floating diffusions FD of the corresponding pixels . . . $PXL_{n-1}$, $PXL_n$, $PXL_{n+1}$ . . . are connected. In the fourth embodiment, the not shown first binning transistor (switch) $84_{N-1}$ which is nearest the other end functions as the shared reset element.

By such a configuration, according to the fourth embodiment, it is possible to flexibly switch the number of connections of floating diffusions FD, so the expandability of the dynamic range is excellent. Further, the number of transistors inside a pixel is small, therefore the aperture ratio of a PD is high, and the photo-electric conversion sensitivity and the number of saturated electrons can be raised.

Next, the operation for realizing a wide dynamic range in a case where a binning switch (binning transistor) is applied to the capacity changing portion according to the fourth embodiment will be explained with reference to FIG. 13.

Figure 13:
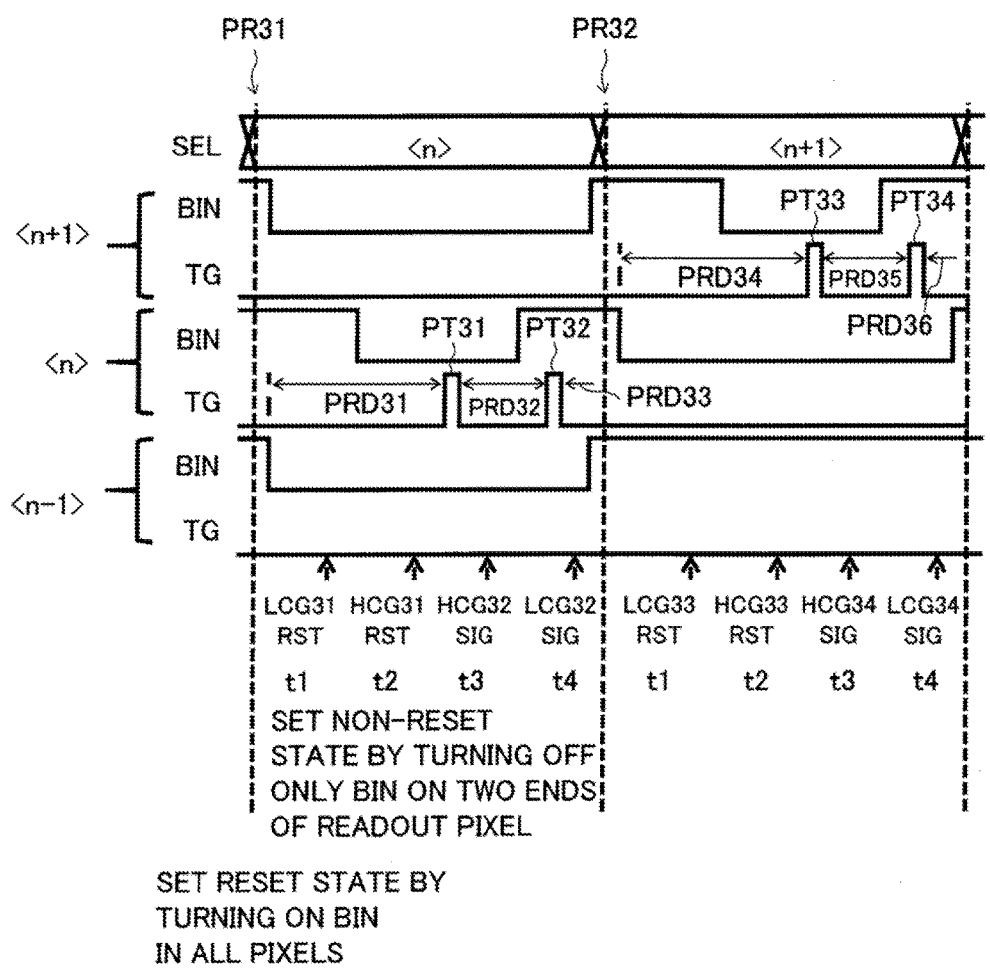
FIG. 13 is a timing chart for explaining the operation for realizing a wide dynamic range in the case where the binning switch is applied to the capacity changing portion according to the fourth embodiment.

FIG. 13 is a timing chart for explaining the operation for realizing a wide dynamic range where a binning switch (binning transistor) is applied to the capacity changing portion according to the fourth embodiment.

In the fourth embodiment, a non-reset state is set by making the capacity changing signals corresponding to the pixels on the two ends of the column output direction of the readout pixels the L level. For example, a non-reset state is set by making the capacity changing signals $BIN_{n-1}$ and $BIN_{n+1}$ corresponding to the pixels $PXL_{n-1}$ and $PXL_{n+1}$ on the two ends in the column output direction of the readout pixels $PXL_n$ the L level. Further, for example, a non-reset state is set by making the capacity changing signals $BIN_n$ and $BIN_{n+2}$ (not shown) corresponding to the pixels $PXL_n$ and $PXL_{n+2}$ (not shown) on the two ends in the column output direction of the readout pixel $PXL_{n+1}$ the L level.

Note, this is one example. In a case of increasing the number of the floating diffusions to be connected, a non-reset state is set not by making the capacity changing signals BIN corresponding to the pixels which are exactly adjacent the L level, but by making the capacity changing signals BIN corresponding to the pixels separated by a plurality of (two or more) rows the L level according to the node of connection.

During the readout scan period PRDO, as shown in FIG. 13, in order to select one row in the pixel array, for example the n-th row, a control line SEL which is connected to each pixel $PXL_n$ in that selected row is set at the H level whereby the selection transistor SEL-Tr in the pixel $PXL_n$ becomes a conductive state. In this selection state, in a reset period PR31, all first binning transistors $84_{n-1}$, $84_n$, and $84_{n+1}$ are selected and became the conductive state for the period where the capacity changing signals $BIN_{n-1}$, $BIN_n$, and $BIN_{n+1}$ are at the H level as the reset signals, and the floating diffusions FD are reset to the potential of the power supply line VDD. After this reset period PR31 passes, the capacity changing signals $BIN_{n-1}$ and $BIN_{n+1}$ are switched to the L level and the first binning transistors $84_{n-1}$ and $84_{n-1}$ are switched to the nonconductive state. On the other hand, the capacity changing signal BIN is held at the H level as it is and the first binning transistor $84_n$ is held in the conductive state. The reset period PR31 ends by the first binning transistors $84_{n-1}$ and $84_{n+1}$ being switched to the nonconductive state and the first binning transistor $84_n$ being held in the conductive state, and the capacity (charge quantity) of the floating diffusion FD in the pixel $PXL_n$ is changed so as to increase from the first capacity to the second capacity. Further, the period up to the start of the transfer period PT31 becomes the first readout period PRD31 for reading out the pixel signal at the time of the reset state.

At the time t1 after the first readout period PRD31 is started, in the state where the capacity changing signal $BIN_n$ is held at the H level, the readout portion 70 performs a first low conversion gain mode reading operation LCG31 for reading out the pixel signal by a low conversion gain (second conversion gain) resulting from the capacity (charge quantity) of the floating diffusion FD being changed to the second capacity. At this time, in each pixel $PXL_n$, due to the source-follower transistor SF-Tr, the charge in the floating diffusion FD is converted to voltage signal in accordance with the charge quantity (potential). This is output as the readout signal VSL (LCG31) of column output to the vertical signal line LSGN, supplied to the readout circuit 40, and for example held.

In the first readout period PRD31, after the first low conversion gain mode reading operation LCG31 is carried out at the time t1, the capacity changing signal $BIN_n$ is switched to L (low level), and the capacity (charge quantity) of the floating diffusion FD is changed so as to decrease from the second capacity to the first capacity. Further, at the time t2, the readout portion 70 performs the first high conversion gain mode reading operation HCG31 for reading out the pixel signal by a high conversion gain (first conversion gain) resulting from the capacity (charge quantity) of the floating diffusion FD being changed. At this time, in each pixel $PXL_n$, due to the source-follower transistor SF-Tr, the charge in the floating diffusion FD is converted to a voltage signal in accordance with the charge quantity (potential). This is output as the readout signal VSL (HCG31) of column output to the vertical signal line LSGN, supplied to the readout circuit 40, and for example held.

Here, the first readout period PRD31 ends, and the first transfer period PT31 starts. Note that, at this time, the capacity changing signal $BIN_n$ is held at the L level as it is in a predetermined period after the first transfer period PT31 passes up to substantially the time immediately before the start of the next second transfer period PT32. In the first transfer period PT31, the transfer transistor TG-Tr is selected and becomes a conductive state for the period where the control line TG is at the H level, and the charge (electrons) which is generated by photo-electric conversion and accumulated in the photodiode PD is transferred to the floating diffusion FD. After this first transfer period PT31 passes (the transfer transistor TG-Tr is in the nonconductive state), the second readout period PRD32 for reading out the pixel signal in accordance with the charge which is generated by photo-electric conversion and accumulated in the photodiode PD starts.

At the time t3 after the second readout period PRD32 is started, in the state where the capacity changing signal $BIN_n$ is set at the L level, the readout portion 70 performs the second high conversion gain mode reading operation HCG32 for reading out the pixel signal by a high conversion gain (first conversion gain) resulting from the capacity (charge quantity) of the floating diffusion FD being set to the first capacity. At this time, in each pixel $PXL_n$, due to the source-follower transistor SF-Tr, the charge in the floating diffusion FD is converted to a voltage signal in accordance with the charge quantity (potential). This is output as the readout signal VSL (HCG32) of column output to the vertical signal line LSGN, supplied to the readout circuit 40, and for example held.

During the second readout period PRD32, after the second high conversion gain made reading operation HCG32 is carried out t the tire t3, the capacity changing signal $BIN_n$ is switched to the H level to change the capacity so that the capacity (charge quantity) of the floating diffusion FD increases from the first capacity to the second capacity. Substantially parallel to this capacity change, the second transfer period PT32 starts. Note that, at this time, the capacity changing signal $BIN_n$ is held at the H level as it is even after the second transfer period PT32 passes. In the second transfer period PT32, the transfer transistor TG-Tr is selected and becomes conductive state for the period where the control line TG is at the high level H, and the charge (electrons) which is generated by photo-electric conversion and accumulated in the photodiode PD is transferred to the floating diffusion FD. After this second transfer period PT32 passes (the transfer transistor TG-Tr is in the nonconductive state), a third readout period PRD33 for further reading out the pixel signal in accordance with the charge which is generated by photo-electric conversion and accumulated in the photodiode PD starts.

At the time t4 after the third readout period PRD33 is started, in the state where the capacity changing signal $BIN_n$ is held at the H level, the readout portion 70 performs the second low conversion gain mode reading operation LCG32 for reading out the pixel signal by a low conversion gain (second conversion gain) resulting from the capacity (charge quantity) of the floating diffusion FD being set to the second capacity. At this time, in each pixel $PXL_n$, due to the source-follower transistor SF-Tr, the charge in the floating diffusion FD is converted to a voltage signal in accordance with the charge quantity (potential). This is output as the readout signal VSL (LCG32) of column output to the vertical signal line LSGN, supplied to the readout circuit 40, and for example held.

Further, in for example the readout circuit 40 configuring a portion of the readout portion 70, a difference {VSL (HCG32)−VSL(HCG31)} between the readout signal VSL (HCG32) of the second high conversion gain mode reading operation HCG32 and the readout signal VSL (HCG31) of the first high conversion gain mode reading operation HCG31 is taken, and CDS processing is carried out. In the same way, in the readout circuit 40, a difference {VSL (LCG32)−VSL(LCG31)} between the readout signal VSL (LCG32) of the second low conversion gain mode reading operation LCG32 and the readout signal VSL (LCG31) of the first low conversion gain node reading operation LCG31 is taken, and CDS processing is carried out.

Next, as shown in FIG. 13, in order to select the row next to the n-th row in the pixel array, for example the n+1-th row, in place of the n-th row, the control line SEL which is connected to each $PXL_{n+1}$ in that selected n+1-th row is set at the H level and the selection transistor SEL-Tr in the pixel $PXL_{n+1}$ becomes a conductive state. At this time, the capacity changing signal $BIN_n$ is held at the H level at the time of access to the n-th row as it is. Further, in this selection state, in the reset period PR32, all first binning transistors $84_{n-1}$, $84_n$, and $84_{n+1}$ are selected and become the conductive state for the period where the capacity changing signals $BIN_{n-1}$, $BIN_n$, and $BIN_{n+1}$ are at the H level as the reset signals, and the floating diffusions FD are reset to the potential of the power supply line VDD. After this reset period PR32 passes, the capacity changing signal $BIN_n$ is switched to the L level and the first binning transistor $84_n$ is switched to the nonconductive state. On the other hand, the capacity changing signals $BIN_{n+1}$ and $BIN_{n-1}$ are held at the H level as they are and the first binning transistors $84_{n+1}$ and $BIN_{n-1}$ are held in the conductive state. The reset period PR32 ends by the first binning transistor $84_n$ being switched to the nonconductive state and the first binning transistors $84_{n+1}$ and $84_{n-3}$ being held in the conductive state, and the capacity (charge quantity) of the floating diffusion FD in the pixel $PXL_{n+1}$ is changed so as to increase from the first capacity to the second capacity. Further, the period up to the start of the transfer period PT33 becomes a first readout period PRD34 for reading out the pixel signal at the time of the reset state.

At the time t1 after the first readout period PRD34 is started, in the state where the capacity changing signal $BIN_{n+1}$ is held at the H level, the readout portion 70 performs a first low conversion gain mode reading operation LCG33 for reading out the pixel signal by a low conversion gain (second conversion gain) resulting from the capacity (charge quantity) of the floating diffusion E) being changed to the second capacity. At this time, in each pixel $PXL_{n+1}$, due to the source-follower transistor SF-Tr, the charge in the floating diffusion FD is converted to a voltage signal in accordance with the charge quantity (potential). This is output as the readout signal VSL (LCG33) of column output to the vertical signal line LSGN, supplied to the readout circuit 40, and for example held.

In the first readout period PRD34, after the first low conversion gain mode reading operation LCG33 is carried out at the time t1, the capacity changing signal $BIN_{n-1}$ is switched to L (low level), and the capacity (charge quantity) of the floating diffusion FD is changed so as to decrease from the second capacity to the first capacity. Further, at the time t2, the readout portion 70 performs the first high conversion gain mode reading operation HCG33 for reading out the pixel signal by a high conversion gain (first conversion gain) resulting from the capacity (charge quantity) of the floating diffusion FD being changed. At this time, in each pixel $PXL_{n+1}$, due to the source-follower transistor SF-Tr, the charge in the floating diffusion FD is converted to a voltage signal in accordance with the charge quantity (potential). This is output as the readout signal VSL (HCG33) of column output to the vertical signal line LSGN, supplied to the readout circuit 40, and for example held.

Here, the first readout period PRD34 ends, and the first transfer period PT33 starts. Note that, at this time, the capacity changing signal $BIN_{n+1}$ is held at the L level as it is in a predetermined period after the first transfer period PT33 passes up to substantially the time immediately before the start of the next second transfer period PT34. In the first transfer period PT33, the transfer transistor TG-Tr is selected and becomes a conductive state for the period where the control line TG is at the H level, and the charge (electrons) which is generated by photo-electric conversion and accumulated in the photodiode PD is transferred to the floating diffusion FD. After this first transfer period PT33 passes (the transfer transistor TG-Tr is in the nonconductive state), a second readout period PRD35 for reading out the pixel signal in accordance with the charge which is generated by photo-electric conversion and accumulated in the photodiode PD starts.

At the time t3 after the second readout period PRD35 is started, in the state where the capacity changing signal $BIN_{n+1}$ is set at the L level, the readout portion 70 performs the second high conversion gain mode reading operation HCG34 for reading out the pixel signal by a high conversion gain (first conversion gain) resulting from the capacity (charge quantity) of the floating diffusion FD being set to the first capacity. At this time, in each pixel $PXL_{n+1}$, due to the source-follower transistor SF-Tr, the charge in the floating diffusion FD is converted to a voltage signal in accordance with the charge quantity (potential). This is output as the readout signal VSL (HCG34) of column output to the vertical signal line LSGN, supplied to the readout circuit 40, and for example held.

During the second readout period PRD35, after the second high conversion gain mode reading operation HCG34 is carried out at the time t3, the capacity changing signal $BIN_{n+1}$ is switched to the H level to change the capacity so that the capacity (charge quantity) of the floating diffusion FD increases from the first capacity to the second capacity. Substantially parallel to this capacity change, the second transfer period PT34 starts. Note that, at this time, the capacity changing signal $BIN_{n+1}$ is held at the H level as it is even after the second transfer period PT34 passes. In the second transfer period PT34, the transfer transistor TG-Tr is selected and becomes a conductive state for the period where the control line TG is at the H level, and the charge (electrons) which is generated by photo-electric conversion and accumulated in the photodiode PD is transferred to the floating diffusion FD. After this second transfer period PT34 passes (the transfer transistor TG-Tr is in the nonconductive state), a third readout period PRD36 for further reading out the pixel signal in accordance with the charge which is generated by photo-electric conversion and accumulated in the photodiode PD starts.

At the time t4 after the third readout period PRD36 is started, in the state where the capacity changing signal $BIN_{n+1}$ is held at the H level, the readout portion 70 performs the second low conversion gain mode reading operation LCG34 for reading out the pixel signal by a low conversion gain (second conversion gain) resulting from the capacity (charge quantity) of the floating diffusion FD being set to the second capacity. At this time, in each pixel $PXL_n$, due to the source-follower transistor SF-Tr, the charge in the floating diffusion FD is converted to a voltage signal in accordance with the charge quantity (potential). This is output as the readout signal VSL (LCG34) of column output to the vertical signal line LSGN, supplied to the readout circuit 40, and for example held.

Further, in for example the readout circuit 40 configuring a portion of the readout portion 70, a difference {VSL (HCG34)−VSL(HCG33)} between the readout signal VSL (HCG34) of the second high conversion gain mode reading operation HCG34 and the readout signal VSL (HCG33) of the first high conversion gain mode reading operation HCG33 is taken, and CDS processing is carried out. In the same way, in the readout circuit 40, a difference {VSL (LCG34)−VSL(LCG33)} between the readout signal VSL (LCG34) of the second low conversion gain mode reading operation LCG34 and the readout signal VSL (LCG33) of the first low conversion gain mode reading operation LCG33 is taken, and CDS processing is carried out.

According to the fourth embodiment, effects same as those by the first and second embodiments explained above can be obtained. That is, according to the fourth embodiment, the following effects can be obtained: With respect to the charge (electrons) which is generated by photo-electric conversion in one accumulation period (exposure period), inside the pixel, in one readout period, signals are output by switching the high conversion gain mode and the low conversion gain mode so both of the bright signal and dark signal can be output, a reset noise at the time of high conversion gain mode and low conversion gain mode can be cancelled, dynamic range widening can be realized while suppressing occurrence of motion distortion, and consequently a higher image quality can be realized.

Further, according to the fourth embodiment, it is possible to flexibly switch the number of connections of the floating diffusions FD, so the expandability of the dynamic range is excellent. Further, the number of transistors inside a pixel is small, therefore the aperture ratio of the PD is high, and the photo-electric conversion sensitivity and the number of saturated electrons can be raised.

Further, according to the fourth embodiment, the readout portion 70, during the readout scan period PRDO, sets a plurality of (two in the present example) transfer periods for performing the transfer processing and performs processing of reading out the signal in accordance with the accumulated charge in each readout period after each transfer period, therefore it becomes possible to reliably realize further widening of dynamic range. Further, according to the fourth embodiment, the readout portion 70, in at least one transfer period (transfer period on the latter stage side in the present example) among the plurality of transfer periods, transfers the accumulated charge from the photo-electric conversion element PD in a state where the capacity of the floating diffusion is made large by the capacity changing portion, therefore it becomes possible to reduce an overflowing charge, the accumulated charge can be effectively utilized, and consequently a higher image quality can be realized.

Fifth Embodiment

Figure 14:
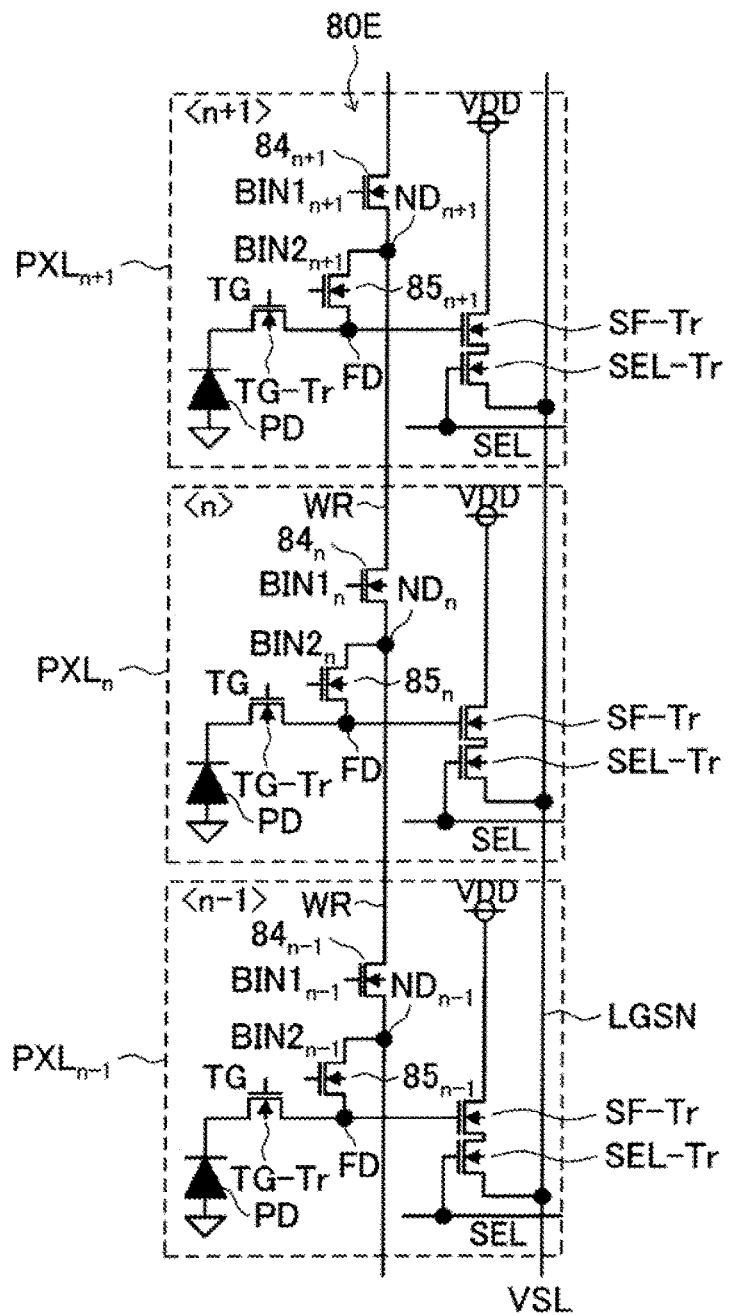
FIG. 14 is a diagram showing an example of the configuration of a pixel portion and capacity changing portion according to a fifth embodiment of the present invention.

FIG. 14 is a diagram showing an example of the configuration of a pixel portion and capacity changing portion according to a fifth embodiment of the present invention.

The difference of a capacity changing portion 80E in the fifth embodiment from the capacity changing portion 80D in the fourth embodiment is as follows. In the fifth embodiment, in addition to the first binning transistors (binning switches) $84_{n-1}$, $84_n$, and $84_{n+1}$ which are formed so as to be cascade connected on the wiring WR and correspond to the pixels, for example, second binning transistors (binning switches) $85_{n-1}$, $85_n$, and $85_{n+1}$ which are formed by NMOS transistors are connected between the floating diffusions FD of the pixels $PXL_{n-1}$, $PXL_n$, and $PXL_{n+1}$, and the nodes $ND_{n-1}$, $ND_n$, and $ND_{n+1}$ of the wiring WR.

The first binning transistors $84_{n-1}$, $84_n$, and $84_{n+1}$ are selectively turned ON or OFF by the first capacity changing signals $BIN1_{n-1}$, $BIN1_n$, and $BIN1_{n+1}$, and the second binning transistors $85_{n-1}$, $85_n$, and $85_{n+1}$ are selectively turned ON or OFF by the second capacity changing signals $BIN2_{n-1}$, $BIN2_n$, and $BIN2_{n+1}$. In the present embodiment, as shown in FIG. 15, the first capacity changing signals $BIN1_{n-1}$, $BIN1_n$, and $BIN1_{n+1}$ and the second capacity changing signals $BIN2_{n-1}$, $BIN2_n$, and $BIN2_{n+1}$ form pairs and are switched to the H level or L level at the same timing (with the same phase).

In such a configuration, the first binning transistors $84_{n-1}$, $84_n$, and $84_{n+1}$ are used for connection and disconnection of the adjacent FD wirings WR. The second binning transistors $85_{n-1}$, $85_n$, and $85_{n+1}$, are arranged in the vicinity of the transfer transistors TG-Tr in the pixels $PXL_{n-1}$, $PXL_n$, and $PXL_{n+1}$. In the high conversion gain mode, they are used for minimizing the parasitic capacitance of a floating diffusion FD node.

Figure 15:
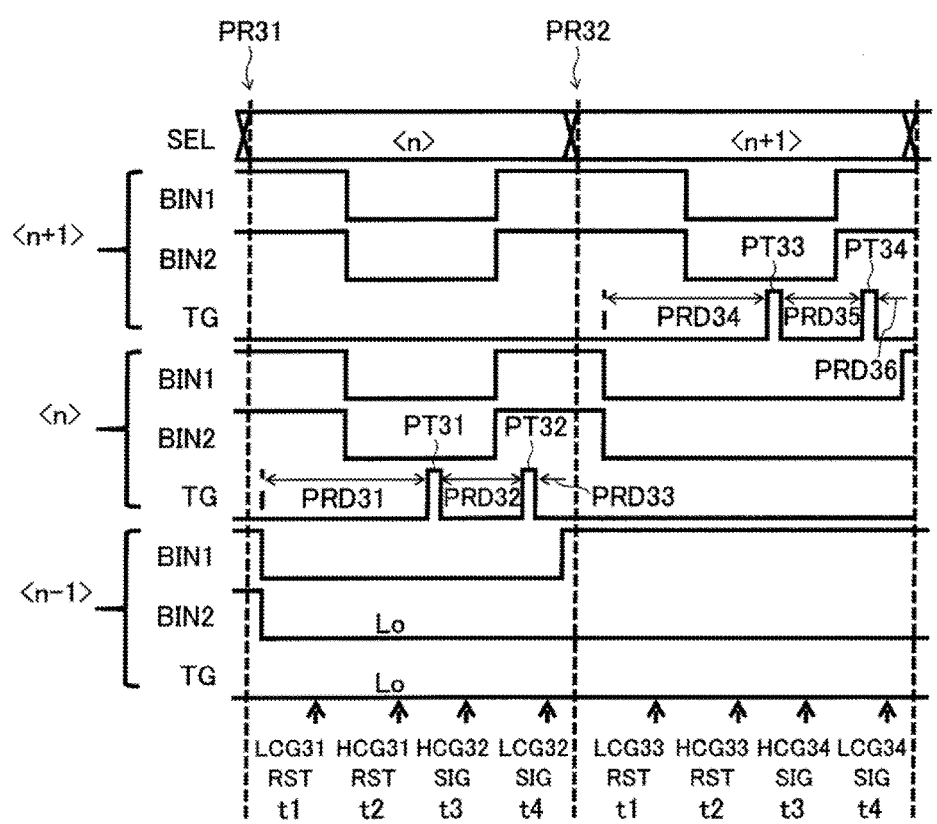
FIG. 15 is a timing chart of the operation for realizing a wide dynamic range in a case where a binning switch is applied to the capacity changing portion according to the fifth embodiment.

FIG. 15 is a timing chart of the operation for realizing a wide dynamic range in a case where the binning switches are applied to the capacity changing portion according to the fifth embodiment. The operation of the fifth embodiment is basically the same as the operation in the fourth embodiment explained before except that the first and second capacity changing signals $BIN1_{n+1}$ and $BIN2_{n+1}$ of the read out pixel, for example the pixel $PXL_{n+1}$ which is adjacent to the upper side of the pixel $PXL_n$ are switched to the H level or L level at the same timing (with the same phase) as that for the first and second capacity changing signals $BIN1_n$ and $BIN2_n$ of the readout pixel $PXL_n$. Accordingly, details of the operation of the fifth embodiment will omitted.

According to the fifth embodiment, the same effects as those by the fourth embodiment explained above can be obtained. That is, according to the fifth embodiment, the following effects can be obtained: With respect to the charge (electrons) which is generated by photo-electric conversion in one accumulation period (exposure period), inside the pixel, in one readout period, signals are output by switching the high conversion gain mode and the low conversion gain mode so both of the bright signal and dark signal can be output, a reset noise at the time of high conversion gain mode and low conversion gain mode can be cancelled, dynamic range widening can be realized while suppressing occurrence of motion distortion, and consequently a higher image quality can be realized. Further, according to the fifth embodiment, it is possible to flexibly switch the number of connections of the floating diffusions FD, so the expandability of the dynamic range is excellent. Further, the number of transistors in a pixel is small, therefore the aperture ratio of the PD is high, and the photo-electric conversion sensitivity and the number of saturated electrons can be raised.

Further, according to the fifth embodiment, in the high conversion gain mode, the parasitic capacitance of a floating diffusion FD node can be minimized.

Further, according to the fifth embodiment, the readout portion 70, during the readout scan period PRDO, sets a plurality of (two in the present example) transfer periods for performing the transfer processing and performs the processing of reading out the signal in accordance with the accumulated charges in each readout period after each transfer period, therefore it becomes possible to reliably realize a further widening of dynamic range. Further, according to the fifth embodiment, the readout portion 70, in at least one transfer period (transfer period on the latter stage side in the present example) among the plurality of transfer periods, transfers the accumulated charge from the photo-electric conversion element PD in a state where the capacity of the floating diffusion is made large by the capacity changing portion, therefore it becomes possible to reduce an overflowing charge, the accumulated charge can be effectively utilized, and consequently a higher image quality can be realized.

Sixth Embodiment

Figure 16:
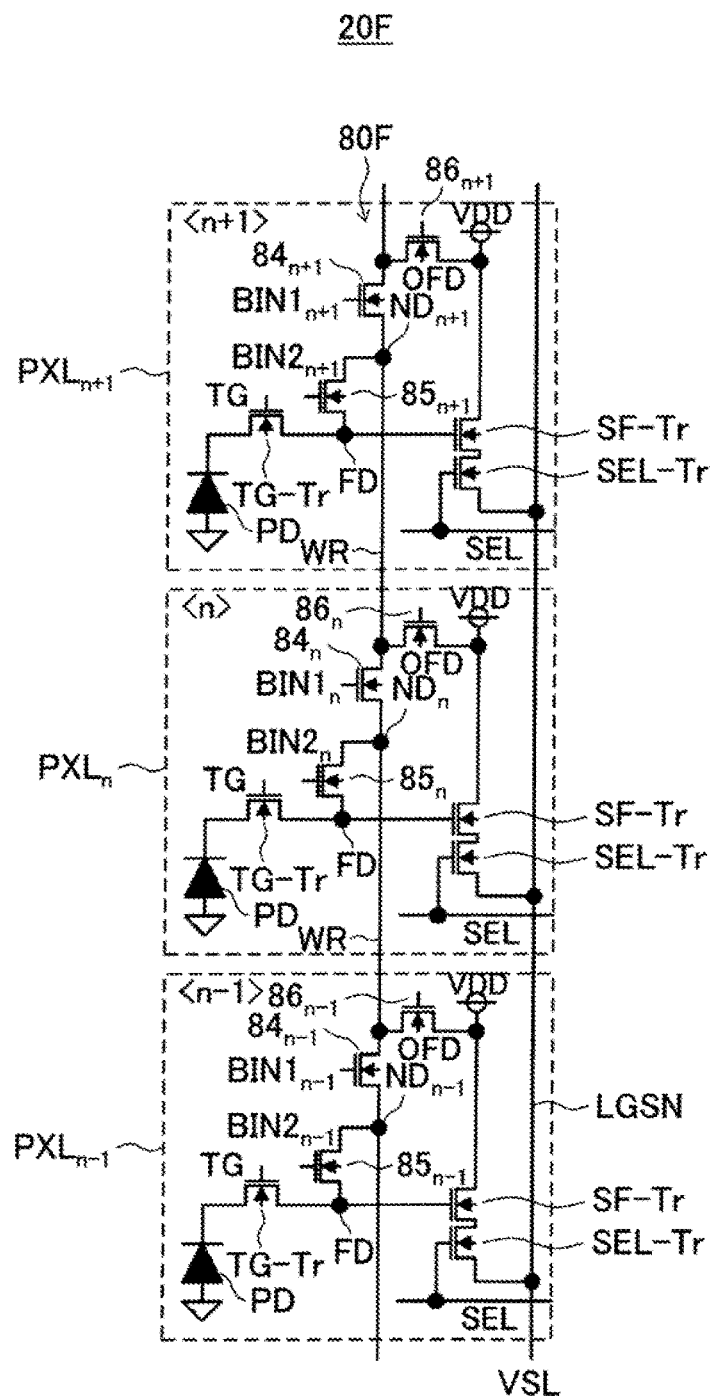
FIG. 16 is a diagram showing an example of the configuration of a pixel portion and capacity changing portion according to a sixth embodiment of the present invention.
Figure 17:
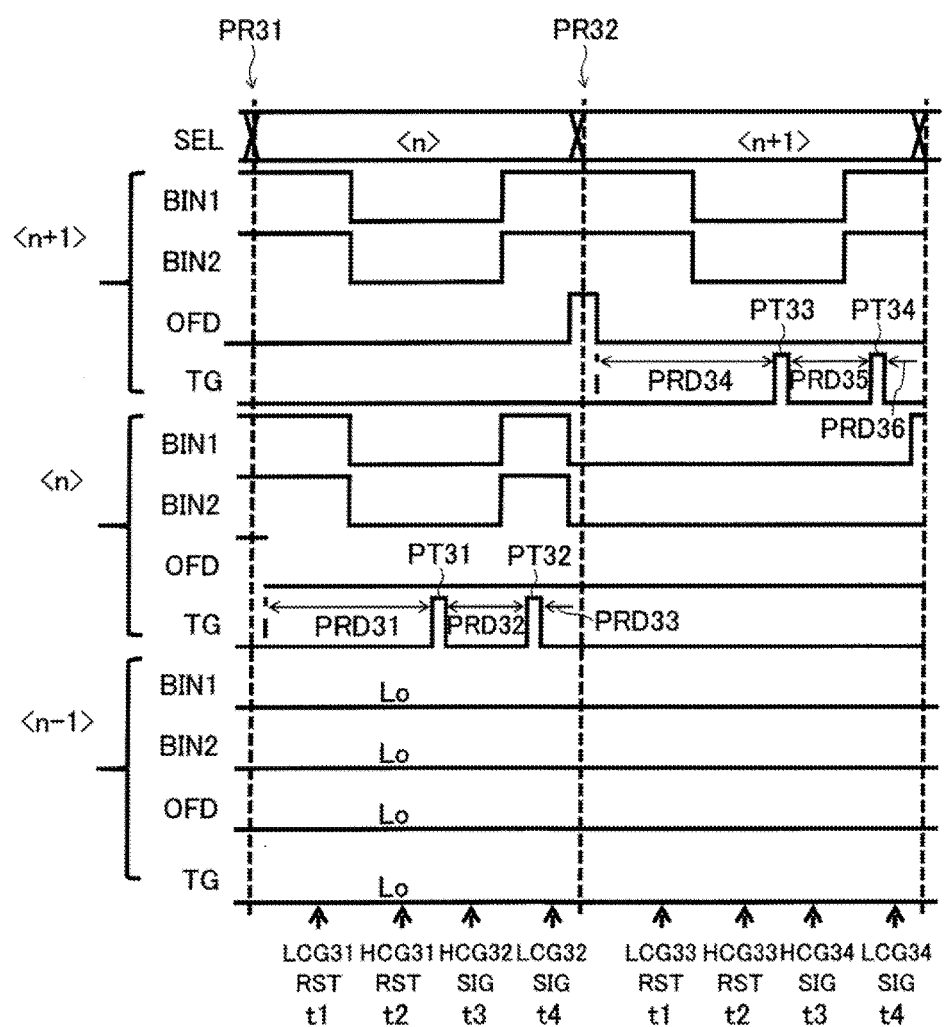
FIG. 17 is a timing chart of the operation for realizing a wide dynamic range in the case where the binning switch is applied to the capacity changing portion according to the sixth embodiment.

FIG. 16 is a diagram showing an example of the configuration of a pixel portion and capacity changing portion according to a sixth embodiment of the present invention. FIG. 17 is a timing chart of the operation for realizing a wide dynamic range in a case where a binning switch is applied to the capacity changing portion according to the sixth embodiment.

The difference of a capacity changing portion 80F in the sixth embodiment from the capacity changing portion 80E in the fifth embodiment is as follows. In the sixth embodiment, in the pixels $PXL_{n-1}$, $PXL_n$, and $PXL_{n+1}$, between the connection portions of the first binning transistors $84_{n-1}$, $84_n$, and $84_{n+1}$ with the upper side adjacent pixels, and the power supply line VDD, overflow drain (OFD) gates $86_{n-1}$, $86_n$, and $86_{n+1}$ are connected.

The OFD gates $86_{n-1}$, $86_n$, and $86_{n+1}$ discharge the overflow electrons to the power supply line (terminals) so that the electrons (charge) which overflow from the photodiodes PD to the floating diffusions FD at the time of high brightness are not leaked to the adjacent pixels.

Further, by setting the voltages of OFD gates $86_{n-1}$, $86_n$, and $86_{n+1}$ higher than the voltages at L level of the first capacity changing signals $BIN1_{n-1}$, $BIN1_n$, and $BIN1_{n+1}$ and second capacity changing signals $BIN2_{n-1}$, $BIN2_n$ and $BIN2_{n+1}$, a reduction of the potentials of the floating diffusions FD in the adjacent pixels due to the electrons (charge) overflowing from the photodiodes PD can be prevented.

Further, as shown in FIG. 17, the OFD gates $86_{n-1}$, $86_n$, and $86_{n+1}$ may be used for reset as well. In contrast to the configuration of providing a reset element and binning switch, the number of elements which are connected to the floating diffusion FD node is smaller, therefore the characteristics at the time of high conversion gain are excellent.

Example of Application

Figure 18:
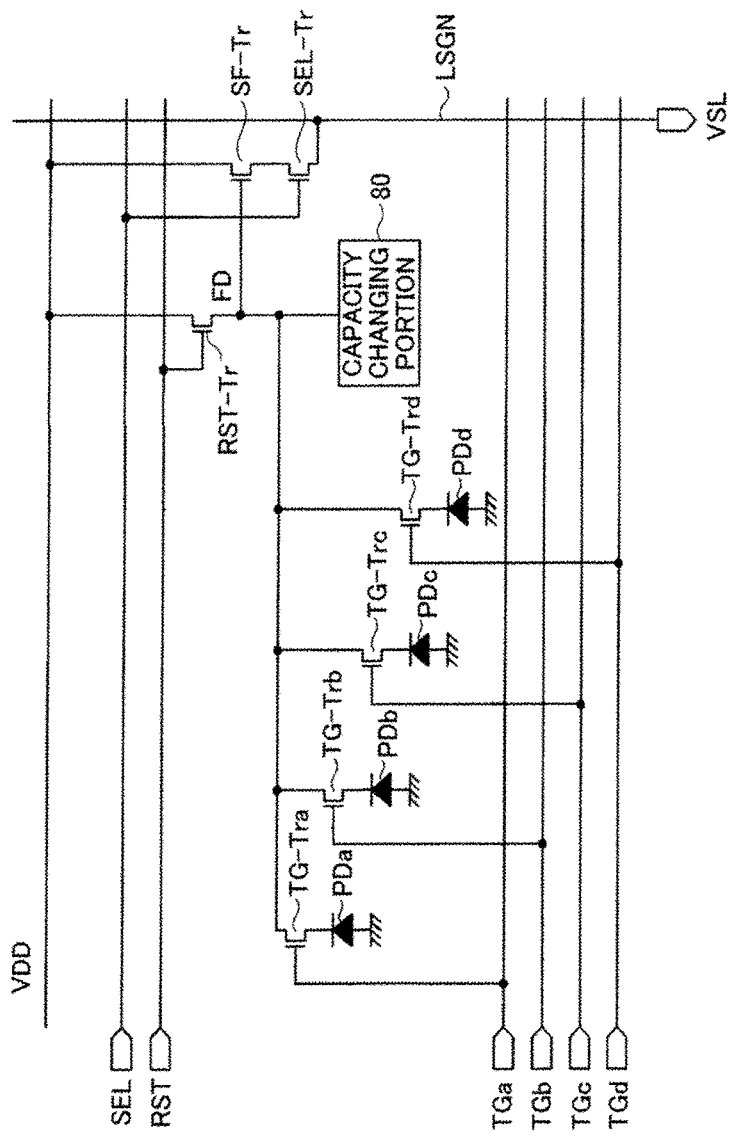
FIG. 18 is a diagram for explaining that a solid-state imaging device according to the embodiment of the present invention can be applied to also a shared pixel structure.

FIG. 18 is a diagram for explaining that the solid-state imaging device according to the embodiment of the present invention can be applied to also a pixel sharing structure.

The solid-state imaging device 10 in the present embodiment explained above, as shown in FIG. 18, can be applied to also a pixel sharing structure in which one floating diffusion FD is shared by a plurality of (four in the example of FIG. 18) photodiodes PDa, PDb, PDc, and PDd.

FIG. 19A and FIG. 19B are diagrams for explaining the fact that the solid-state imaging device according to an embodiment of the present invention can be applied to both of a front-surface irradiation type image sensor and a back-surface irradiation type image sensor: FIG. 19A shows a simplified configuration of the front-surface irradiation type image sensor, and FIG. 19B shows a simplified configuration of the back-surface irradiation type image sensor.

In FIG. 19, notation 91 indicates a microlens array, 92 indicates a color filter group, 93 indicates a wiring layer, and 94 indicates a silicon substrate.

The solid-state imaging device 10 in the present embodiment explained above, as shown in FIG. 19A and FIG. 19B, can be applied to both of a front-surface irradiation type image sensor (FSI) and back-surface irradiation type image sensor (BSI).

The solid-state imaging device 10 explained above can be applied as an imaging device to a digital camera or video camera, portable terminal, or monitoring camera, medical endoscope, or other electronic apparatus.

Figure 20:
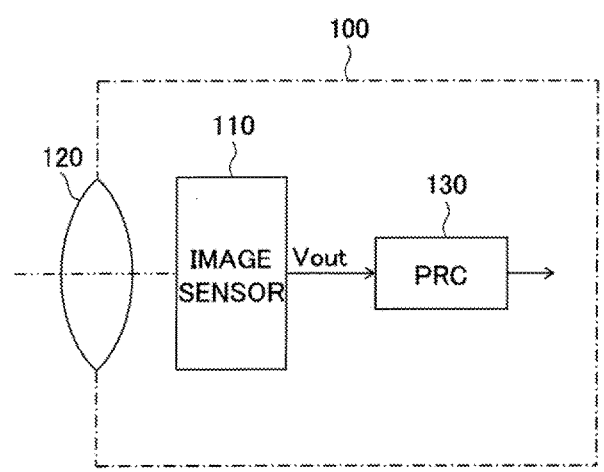
FIG. 20 is a diagram showing an example of the configuration of an electronic apparatus to which a solid-state imaging device according to an embodiment of the present invention is applied.

FIG. 20 is a diagram showing an example of the configuration of an electronic apparatus having a camera system to which a solid-state imaging device according to an embodiment of the present invention is applied mounted therein.

The electronic apparatus 100, as shown in FIG. 20, has a CMOS image sensor 110 to which the solid-state imaging device 10 according to the present embodiment can be applied. Further, the electronic apparatus 100 has an optical system (lens etc.) 120 for guiding the incident light to the pixel region of this CMOS image sensor 110 (forming an object image). The electronic apparatus 100 has a signal processing circuit (PRC) 130 for processing the output signal of the CMOS image sensor 110.

The signal processing circuit 130 applies predetermined signal processing to the output signal of the CMOS image sensor 110. The image signal which is processed in the signal processing circuit 130 can be projected as a moving picture on a monitor configured by a liquid crystal display or the like or can be output to a printer. Further, for example, it can be directly stored in a memory card or other storage medium. Various aspects are possible.

As explained above, by mounting the solid-state imaging device 10 explained before as the CMOS image sensor 110, it becomes possible to provide a high performance, small-sized, and low cost camera system. Further, an electronic apparatus used for applications restricted in the mounting size, number of cables which can be connected, length of the cables, or set heights as requirements of camera installation, for example, a monitoring camera or medical endoscope, can be realized.

The invention claimed is:

1. A solid-state imaging device comprising a pixel portion in which pixels are arranged, wherein
    the pixel portion includes a first wiring which is formed over a plurality of pixels in the same column or row in order to connect floating diffusions of at least two adjacent pixels, and
    each pixel includes
    a photo-electric conversion element which accumulates a charge generated by photo-electric conversion in an accumulation period,
    a transfer element capable of transferring the charge accumulated in the photo-electric conversion element in a transfer period,
    a floating diffusion to which the charge accumulated in the photo-electric conversion element is transferred through the transfer element,
    a source-follower element which converts the charge of the floating diffusion to a voltage signal by a gain in accordance with the charge quantity, and
    a capacity changing portion capable of changing the capacity of the floating diffusion in accordance with a capacity changing signal,
    a second wiring connecting the floating diffusion to the first wiring, and
    a connection node to the second wiring in the first wiring, wherein
    the capacity of the floating diffusion is changed by the capacity changing portion in a predetermined period in one readout period with respect to the accumulation period and a conversion gain is switched in the one readout period, and wherein
    the capacity changing portion
    includes a binning switch which is connected to the first wiring between the connection nodes in at least two adjacent the pixels and is selectively turned on or off in accordance with the capacity changing signal and
    switches the number of floating diffusions to be connected and switches the conversion gain of the floating diffusion of the pixel to be read out.

2. A solid-state imaging device as set forth in claim 1, wherein all of a plurality of pixels which are connected through the binning switches share a reset element which discharges the charges in the floating diffusions in a reset period.

3. A solid-state imaging device as set forth in claim 1, wherein the capacity changing portion includes
    a first binning switch which is connected to the first wiring between the connection nodes of two adjacent the pixels and is selectively turned on or off in accordance with a first capacity changing signal and
    a second binning switch which is connected the first wiring and the floating diffusion which is a wiring nearer the transfer element side than the first binning switch and is selectively turned on or off in accordance with a second capacity changing signal.

4. A solid-state imaging device as set forth in claim 3, wherein the capacity changing portion has an overflow gate which is connected to the first binning switch and discharges an overflowing charge from the floating diffusion.

5. A solid-state imaging device as set forth in claim 1, further comprising
    a readout portion for reading out a pixel signal from the pixel portion, wherein
    the readout portion performs, in one the readout period, at least one of
    a first conversion gain mode reading operation for reading out a pixel signal by a first conversion gain in accordance with a first capacity which is set by the capacity changing portion and
    a second conversion gain mode reading operation for reading out a pixel signal by a second conversion gain in accordance with a second capacity which is set by the capacity changing portion.

6. A solid-state imaging device as set forth in claim 5, further comprising
    a reset element which discharges the charge of the floating diffusion in a reset period, wherein
    the readout portion performs the first conversion gain mode reading operation and the second conversion gain mode reading operation in the readout period operation following the reset period.

7. A solid-state imaging device as set forth in claim 6, wherein the readout portion performs at least one of the first conversion gain mode reading operation and the second conversion gain mode reading operation in a readout period after at least one transfer period which starts after the readout period following the reset period.

8. A solid-state imaging device as set forth in claim 5, wherein the second capacity is larger than the first capacity.

9. A solid-state imaging device as set forth in claim 1, wherein the pixel portion has a pixel shared structure where one floating diffusion is shared by a plurality of the photo-electric conversion elements and the transfer elements.

10. A solid-state imaging device as set forth in claim 1, wherein the solid-state imaging device is a front-surface irradiation type or back-surface irradiation type.

11. A method for driving a solid-state imaging device having a pixel portion in which pixels are arranged, wherein
the pixel portion includes a first wiring which is formed over a plurality of pixels in the same column or row in order to connect floating diffusions of at least two adjacent pixels, and
each pixel includes
a photo-electric conversion element which accumulates a charge generated by photo-electric conversion in an accumulation period,
a transfer element capable of transferring the charge accumulated in the photo-electric conversion element in a transfer period,
a floating diffusion to which the charge accumulated in the photo-electric conversion element is transferred through the transfer element,
a source-follower element which converts the charge of the floating diffusion to a voltage signal by a gain in accordance with the charge quantity, and
a capacity changing portion capable of changing the capacity of the floating diffusion in accordance with a capacity changing signal,
a second wiring connecting the floating diffusion to the first wiring, and
a connection node to the second wiring in the first wiring,
comprising changing the capacity of the floating diffusion by the capacity changing portion in the predetermined period in one readout period with respect to the accumulation period and switching a conversion gain in the one readout period,
the method for driving a solid-state imaging device comprising
forming the capacity changing portion
by forming the first wiring corresponding to the pixel arrangement of the pixel portion,
by connecting the floating diffusions of at least two adjacent the pixels to the first wiring by the second wirings, and
by connecting a binning switch to the first wiring between the connection nodes in at least two adjacent pixels, and
selectively turning the binning switch on or off in accordance with the capacity changing signal to switch the number of floating diffusions connected and switch the conversion gains of the floating diffusions of the read out pixels.

12. An electronic apparatus comprising
a solid-state imaging device which includes a pixel portion in which pixels are arranged and
an optical system which forms an object image at the solid-state imaging device, wherein
the pixel portion of the solid-state imaging device includes a first wiring which is formed over a plurality of pixels in the same column or row in order to connect floating diffusions of at least two adjacent pixels, and
each pixel of the solid-state imaging device includes
a photo-electric conversion element which accumulates a charge generated by photo-electric conversion in an accumulation period,
a transfer element capable of transferring the charge accumulated in the photo-electric conversion element in a transfer period,
a floating diffusion to which the charge accumulated in the photo-electric conversion element is transferred through the transfer element,
a source-follower element which converts the charge of the floating diffusion to a voltage signal by a gain in accordance with the charge quantity, and
a capacity changing portion capable of changing the capacity of the floating diffusion in accordance with a capacity changing signal,
a second wiring connecting the floating diffusion to the first wiring, and
a connection node to the second wiring in the first wiring, wherein
the capacity of the floating diffusion is changed by the capacity changing portion in a predetermined period in one readout period with respect to the accumulation period and a conversion gain is switched in the one readout period, and wherein
the capacity changing portion
includes a binning switch which is connected to the first wiring between the connection nodes in at least two adjacent the pixels and is selectively turned on or off in accordance with the capacity changing signal and
switches the number of floating diffusions to be connected and switches the conversion gain of the floating diffusion of the pixel to be read out.

* * * * *